(12) United States Patent
Du et al.

(10) Patent No.: US 11,997,897 B2
(45) Date of Patent: May 28, 2024

(54) DISPLAY SUBSTRATE INCLUDING CONNECTION LINE AND POWER LINE SURROUNDING DISPLAY AREA, PREPARATION METHOD THEREOF, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Lili Du, Beijing (CN); Benlian Wang, Beijing (CN); Yue Long, Beijing (CN); Weiyun Huang, Beijing (CN); Binyan Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 387 days.

(21) Appl. No.: 17/608,747

(22) PCT Filed: Feb. 10, 2021

(86) PCT No.: PCT/CN2021/076457
§ 371 (c)(1),
(2) Date: Nov. 3, 2021

(87) PCT Pub. No.: WO2022/170547
PCT Pub. Date: Aug. 18, 2022

(65) Prior Publication Data
US 2023/0255067 A1    Aug. 10, 2023

(51) Int. Cl.
*H10K 59/131*    (2023.01)
*H10K 59/12*    (2023.01)
(Continued)

(52) U.S. Cl.
CPC ....... *H10K 59/131* (2023.02); *H10K 59/1201* (2023.02); *H10K 59/1213* (2023.02); *H10K 59/353* (2023.02); *H10K 71/00* (2023.02)

(58) Field of Classification Search
CPC ........... H10K 59/1201; H10K 59/1213; H10K 59/131; H10K 59/30; H10K 59/35; H10K 59/353; H10K 71/00
(Continued)

(56) References Cited

U.S. PATENT DOCUMENTS

2015/0116295 A1*  4/2015  Pyon ................... G09G 3/3233
                                                      345/80
2016/0035284 A1*  2/2016  Jung ....................... G06F 1/163
                                                      345/82
(Continued)

FOREIGN PATENT DOCUMENTS

CN    109360838 A    2/2019
CN    109686311 A    4/2019
(Continued)

*Primary Examiner* — Matthew E. Gordon
(74) *Attorney, Agent, or Firm* — Ling Wu; Stephen Yang; Ling and Yang Intellectual Property

(57) ABSTRACT

A display substrate includes a display region and a peripheral region on a periphery of the display region. At least multiple sub-pixels are arranged in the display region. At least one sub-pixel includes a pixel driving circuit arranged on an underlay substrate and a light emitting element connected with the pixel driving circuit. The pixel driving circuit is connected with a first initial signal line. The first initial signal line is arranged to provide a first initial voltage to the light emitting element under the control of the pixel driving circuit. A first power line and a signal connection line are arranged in the peripheral region. The first initial signal line is connected with the first power line through the signal connection line in the peripheral region.

20 Claims, 18 Drawing Sheets

(51) Int. Cl.
*H10K 59/121* (2023.01)
*H10K 59/35* (2023.01)
*H10K 71/00* (2023.01)

(58) Field of Classification Search
USPC .......................................................... 257/40
See application file for complete search history.

(56) References Cited

U.S. PATENT DOCUMENTS

| | | |
|---|---|---|
| 2016/0322443 A1 | 11/2016 | Her et al. |
| 2017/0062546 A1* | 3/2017 | Kim .................... G09G 3/3225 |
| 2019/0165079 A1 | 5/2019 | Cho et al. |
| 2020/0168691 A1* | 5/2020 | Choi .................... H10K 50/858 |
| 2020/0294752 A1 | 9/2020 | Sun et al. |
| 2021/0020084 A1 | 1/2021 | Fan et al. |
| 2022/0068212 A1 | 3/2022 | Yao et al. |
| 2022/0157913 A1* | 5/2022 | Choi .................... H10K 59/131 |

FOREIGN PATENT DOCUMENTS

| | | |
|---|---|---|
| CN | 109742037 A | 5/2019 |
| CN | 110085644 A | 8/2019 |
| CN | 110867525 A | 3/2020 |
| CN | 111370458 A | 7/2020 |
| CN | 111489698 A | 8/2020 |
| CN | 111668273 A | 9/2020 |
| CN | 111816691 A | 10/2020 |
| CN | 112133729 A | 12/2020 |
| KR | 20160129187 A | 11/2016 |

\* cited by examiner

DISPLAY SUBSTRATE INCLUDING CONNECTION LINE AND POWER LINE SURROUNDING DISPLAY AREA, PREPARATION METHOD THEREOF, AND DISPLAY DEVICE

CROSS-REFERENCE TO RELATED APPLICATION

The present application is a U.S. National Phase Entry of International Application No. PCT/CN2021/076457 having an international filing date of Feb. 10, 2021, the entire content of which is hereby incorporated by reference.

TECHNICAL FIELD

The present disclosure relates, but not limited, to the technical field of display, and particularly to a display substrate, a preparation method thereof, and a display device.

BACKGROUND

As an active light emitting display device, an Organic Light Emitting Diode (OLED) has the advantages of autoluminescence, wide viewing angle, high contrast, low power consumption, extremely quick response, etc. With the constant development of a display technology, a display device that adopts an OLED as a light emitting element and adopts a Thin Film Transistor (TFT) for signal control has become a mainstream product in the field of display at present.

SUMMARY

The below is a summary about the subject matter described in the present disclosure in detail. The summary is not intended to limit the scope of protection of the claims.

At least one embodiment of the present disclosure provides a display substrate, a preparation method thereof, and a display device.

According to an aspect, an embodiment of the present disclosure provides a display substrate, which includes a display region and a peripheral region on a periphery of the display region. At least multiple sub-pixels are arranged in the display region. At least one sub-pixel includes a pixel driving circuit arranged on an underlay substrate and a light emitting element connected with the pixel driving circuit. The pixel driving circuit is connected with a first initial signal line. The first initial signal line is arranged to provide a first initial voltage to the light emitting element under the control of the pixel driving circuit. A first power line and a signal connection line are arranged in the peripheral region. The first initial signal line is connected with the first power line through the signal connection line in the peripheral region.

In some exemplary implementation modes, the peripheral region includes a first border region, a second border region, and a bonding pin region. The bonding pin region is on one side of the display region. The first border region is between the bonding pin region and the display region. The second border region is connected with the first border region to surround the display region. The signal connection line includes a first connection line. The first connection line is connected with the first initial signal line and the first power line in the second border region. The first connection line is on a side of the first power line close to the display region.

In some exemplary implementation modes, the first connection line is on a side of the first power line away from the underlay substrate.

In some exemplary implementation modes, the signal connection line further includes a second connection line. The second connection line is connected with the first initial signal line and connected with the first power line through the first connection line. The second connection line is on a side of the first connection line close to the display region.

In some exemplary implementation modes, the second connection line is on a side of the first connection line close to the underlay substrate and is on a side of the first initial signal line away from the underlay substrate.

In some exemplary implementation modes, the second connection line is in the same layer as the first power line.

In some exemplary implementation modes, an extending direction of the first connection line in the peripheral region intersects with an extending direction of the first initial signal line in the display region.

In some exemplary implementation modes, the display region includes a driving structure layer arranged on the underlay substrate and the light emitting element. The light emitting element includes a first electrode, a second electrode, and an organic light emitting layer arranged between the first electrode and the second electrode. The first electrode is on a side of the second electrode close to the underlay substrate. The first connection line is in the same layer as the first electrode of the light emitting element.

In some exemplary implementation modes, the driving structure layer includes a semiconductor layer, first gate metal layer, second gate metal layer, and source and drain metal layer which are arranged on the underlay substrate. The first initial signal line is in the same layer as the second gate metal layer. The first power line is in the same layer as the source and drain metal layer.

In some exemplary implementation modes, the peripheral region includes a first border region, a second border region, and a bonding pin region. The bonding pin region is on one side of the display region. The first border region is between the bonding pin region and the display region. The second border region is connected with the first border region to surround the display region. The signal connection line includes a third connection line. The third connection line is connected with the first initial signal line in the second border region and connected with the first power line in the first border region.

In some exemplary implementation modes, the third connection line and the first power line are integrated.

In some exemplary implementation modes, the signal connection line further includes a fourth connection line. The third connection line is connected with the fourth connection line. The fourth connection line is connected with the first power line in the first border region. The fourth connection line is on a side of the first power line close to the underlay substrate.

In some exemplary implementation modes, the pixel driving circuit includes a first transistor to a seventh transistor. A control electrode of the first transistor is connected with a second scanning line, a first electrode of the first transistor is connected with a second initial signal line, and a second electrode of the first transistor is connected with a first node. A control electrode of the second transistor is connected with a first scanning line, a first electrode of the second transistor is connected with the first node, and a second electrode of the second transistor is connected with a third node. A control electrode of the third transistor is connected with the first node, a first electrode of the third transistor is connected with a second node, and a second electrode of the third transistor is connected with the third node. A control electrode of the fourth transistor is connected with a first scanning signal line, a first electrode of the fourth transistor is connected with a data signal line, and a second electrode of the fourth transistor is connected with the second node. A control electrode of the fifth transistor is connected with a light emitting signal line, a first electrode of the fifth transistor is connected with a second power line, and a second electrode of the fifth transistor is connected with the second node. A control electrode of the sixth transistor is connected with the light emitting signal line, a first electrode of the sixth transistor is connected with the third node, and a second electrode of the sixth transistor is connected with a fourth node. A control electrode of the seventh transistor is connected with the first scanning signal line, a first electrode of the seventh transistor is connected with the first initial signal line, and a second electrode of the seventh transistor is connected with the fourth node. A first electrode of the light emitting element is connected with the fourth node, and a second electrode of the light emitting element is connected with the first power line.

According to another aspect, an embodiment of the present disclosure also provides a display device, which includes the abovementioned display substrate.

According to another aspect, an embodiment of the present disclosure provides a preparation method of a display substrate, which is used for preparing the abovementioned display substrate. The preparation method includes that: multiple sub-pixels are formed in a display region, and a first power line and a signal connection line are formed in a peripheral region on a periphery of the display region. Herein, at least one sub-pixel includes a pixel driving circuit arranged on an underlay substrate and a light emitting element connected with the pixel driving circuit. The pixel driving circuit is connected with a first initial signal line. The first initial signal line is arranged to provide a first initial voltage to the light emitting element under the control of the pixel driving circuit. The first initial signal line is connected with the first power line through the signal connection line in the peripheral region.

After the drawings and the detailed descriptions are read and understood, the other aspects may be comprehended.

BRIEF DESCRIPTION OF DRAWINGS

The drawings are used to provide an understanding to the technical solutions of the present disclosure, form a part of the specification, and are adopted to explain, together with the embodiments of the present disclosure, the technical solutions of the present disclosure and not intended to form limits to the technical solutions of the present disclosure. The shapes and sizes of one or more components in the drawings do not reflect the true scale, and are only intended to schematically describe the contents of the present disclosure.

DETAILED DESCRIPTION

Figure 1:
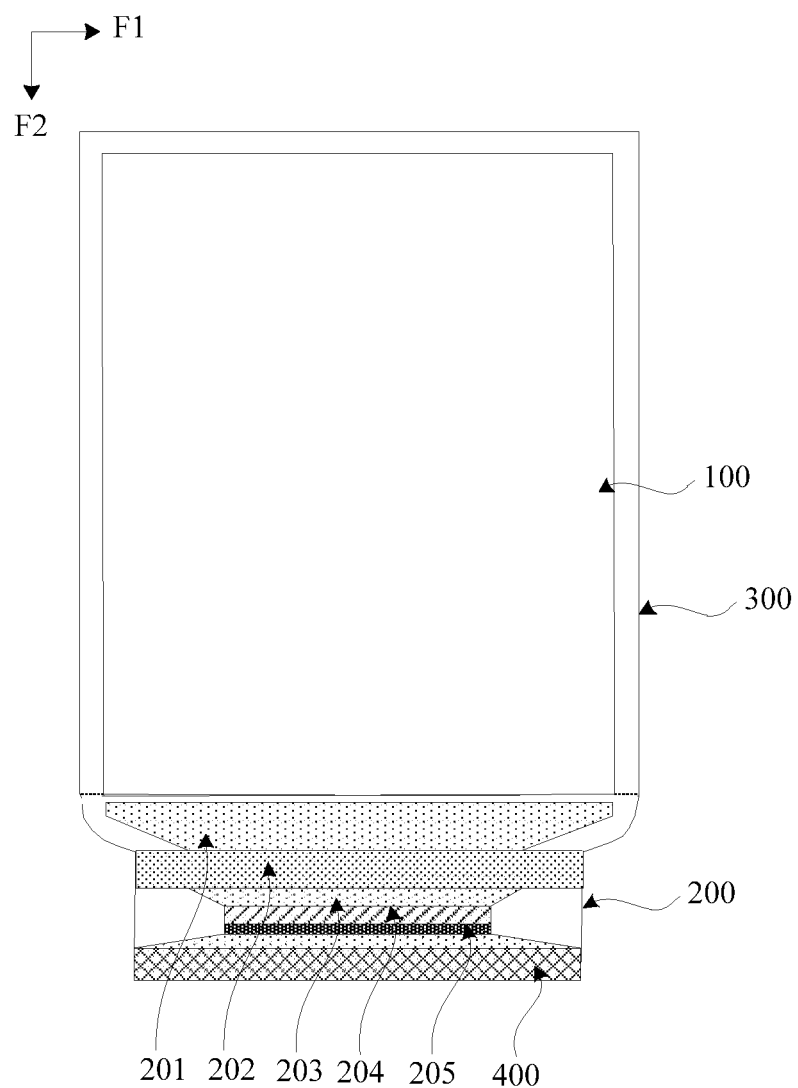
FIG. 1 is a schematic diagram of a display substrate according to at least one embodiment of the present disclosure.

The embodiments of the present disclosure will be described below in combination with the drawings in detail. The implementation modes may be implemented in various forms. Those of ordinary skill in the art can easily understand such a fact that manners and contents may be transformed into one or more forms without departing from the purpose and scope of the present disclosure. Therefore, the present disclosure should not be explained as being limited to the contents recorded in the following implementation modes only. The embodiments in the present disclosure and the features in the embodiments can be freely combined without conflicts.

In the drawings, the size/sizes of one or more composition elements, the thicknesses of layers, or regions are exaggerated sometimes for clarity. Therefore, a mode of the present disclosure is not always limited to the size, and the shapes and sizes of each component in the drawings do not reflect the true scale. In addition, the drawings schematically illustrate ideal examples, and a mode of the present disclosure is not limited to the shapes, numerical values, or the like shown in the drawings.

Ordinal numerals "first", "second", and "third" in the present disclosure are set not to form limits in number but only to avoid the confusion of composition elements. In the present disclosure, "multiple" represents two or more than two.

In the present disclosure, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where the composition elements are described. Therefore, appropriate replacements based on situations are allowed, not limited to the expressions in the specification.

In the present disclosure, unless otherwise specified and defined, terms "mounting", "mutual connection", and "connection" should be generally understood. For example, the term may be fixed connection, or detachable connection, or integral connection. The term may be mechanical connection or electric connection. The term may be direct connection, or indirect connection through an intermediate, or communication inside two elements. Those of ordinary skill in the art may understand the meanings of the terms in the present disclosure according to specific situations. Herein, "electric connection" includes connection of the composition elements through an element with a certain electric action. "The element with the certain electric action" is not particularly limited as long as electric signals between the connected composition elements may be sent and received. Examples of "the element with the certain electric action" not only include an electrode and a line, but also include a switch element such as a transistor, a resistor, an inductor, a capacitor, another element with one or more functions, etc.

In the present disclosure, the transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. In the present disclosure, the channel region refers to a main region that the current flows through.

In the present disclosure, for distinguishing the two electrodes, except the gate, of the transistor, one electrode is called a first electrode, the other electrode is called a second electrode. The first electrode may be the source or the drain, and the second electrode may be the drain or the source. In addition, the gate of the transistor is called a control electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode" may be exchanged in the present disclosure.

In the present disclosure, "parallel" refers to a state that an angle formed by two straight lines is larger than −10° and smaller than 10°, and thus may also include a state that the angle is larger than −5° and smaller than 5°. In addition, "perpendicular" refers to a state that an angle formed by two straight lines is larger than 800 and smaller than 100°, and thus may also include a state that the angle is larger than 850 and smaller than 95°.

In the present disclosure, "film" and "layer" may be exchanged. For example, "conductive layer" may be replaced with "conductive film" sometimes. Similarly, "insulating film" may be replaced with "insulating layer" sometimes.

In the present disclosure, "about" and "approximate" refer to that a boundary is defined not so strictly and situations in process and measurement error ranges are allowed.

At least one embodiment of the present disclosure provides a display substrate, which includes a display region and a peripheral region on a periphery of the display region. At least multiple sub-pixels are arranged in the display region. At least one sub-pixel includes a pixel driving circuit arranged on an underlay substrate and a light emitting element connected with the pixel driving circuit. The pixel driving circuit is connected with a first initial signal line. The first initial signal line is arranged to provide a first initial voltage to the light emitting element under the control of the pixel driving circuit. A first power line and a signal connection line are arranged in the peripheral region. The first initial signal line is connected with the first power line through the signal connection line in the peripheral region.

According to the present embodiment, the first power line and the first initial signal line are electrically connected in the peripheral region through the signal connection line such that the first initial voltage provided by the first initial signal line is a first power voltage provided by the first power line. The light emitting element may be initialized using the first power voltage provided by the first power line to improve the uniformity of the display substrate under high and low gray-scales and avoid the addition of a pin and wiring space for introducing the first initial voltage in the peripheral region.

In some exemplary implementation modes, the peripheral region includes a first border region, a second border region, and a bonding pin region. The bonding pin region is on one side of the display region. The first border region is between the bonding pin region and the display region. The second border region is connected with the first border region to surround the display region. The signal connection line includes a first connection line. The first connection line is connected with the first initial signal line and the first power line in the second border region. The first connection line is on a side of the first power line close to the display region. In the present exemplary implementation mode, the first initial signal line and the first power line are electrically connected in the border region through the first connection line, so that the addition of a pin for introducing the first initial voltage in the bonding pin region and the addition of a wiring space for introducing the first initial voltage in the first border region may be avoided.

In some exemplary implementation modes, the first connection line is on a side of the first power line away from the underlay substrate in a plane perpendicular to the display substrate. In some examples, the display region includes a driving structure layer arranged on the underlay substrate and the light emitting element. The light emitting element includes a first electrode, a second electrode, and an organic light emitting layer arranged between the first electrode and the second electrode. The first electrode is on a side of the second electrode close to the underlay substrate. The first connection line may be in the same layer as the first electrode of the light emitting element. The driving structure layer includes a semiconductor layer, first gate metal layer, second gate metal layer, and source and drain metal layer which are arranged on the underlay substrate. The first initial signal line may be in the same layer as the second gate metal layer. The first power line may be in the same layer as the source and drain metal layer. However, no limits are made thereto in the present embodiment. In some examples, the driving structure layer may include a semiconductor layer, first gate metal layer, second gate metal layer, first source and drain metal layer, and second source and drain metal layer which are arranged on the underlay substrate. The first initial signal line may be in the same layer as the second gate metal layer, the first power line may be in the same layer as the first source and drain metal layer, and the first connection line may be in the same layer as the second source and drain metal layer. Alternatively, the first power line may be in the same layer as the second source and drain metal layer, and the first power line may be in the same layer as the first electrode of the light emitting element.

In some exemplary implementation modes, the signal connection line may include a first connection line and a second connection line. The second connection line is connected with the first initial signal line and connected with the first power line through the first connection line. The second connection line is on a side of the first connection line close to the display region. Herein, the second connection line is connected with the first connection line in the second border region, and the first connection line is connected with the first power line in the second border region. In some examples, the second connection line is on a side of the first connection line close to the underlay substrate and is on a side of the first initial signal line away from the underlay substrate in the plane perpendicular to the display substrate. For example, the first initial signal line may be in the same layer as the second gate metal layer in the display region, the second connection line may be in the same layer as the source and drain metal layer in the display region, and the first connection line may be in the same layer as the first electrode of the light emitting element. However, no limits are made thereto in the present embodiment.

In some exemplary implementation modes, the second connection line may be in the same layer as the first power line. For example, both the second connection line and the first power line are in the same layer as the source and drain metal layer in the display region. However, no limits are made thereto in the present embodiment. In some examples, the second connection line may be in a different layer from the first power line. For example, the second connection line may be in the same layer as the first source and drain metal layer in the display region, and the first power line may be in the same layer as the second source and drain metal layer in the display region.

In some exemplary implementation modes, an extending direction of the first connection line in the peripheral region intersects with an extending direction of the first initial signal line in the display region. For example, the first initial signal line extends in the display region along a horizontal direction, and the first connection line extends in the peripheral region along a vertical direction. Alternatively, for example, the first initial signal line extends in the display region along the vertical direction, and the first connection line extends in the peripheral region along the horizontal direction. However, no limits are made thereto in the present embodiment.

In some exemplary implementation modes, the peripheral region includes a first border region, a second border region, and a bonding pin region. The bonding pin region is on one side of the display region. The first border region is between the bonding pin region and the display region. The second border region is connected with the first border region to surround the display region. The signal connection line includes a third connection line. The third connection line is connected with the first initial signal line in the second border region and connected with the first power line in the first border region. In the present exemplary implementation mode, the third connection line and the first power line are connected in the first border region, so that addition of a pin for introducing the first initial voltage in the bonding pin region may be avoided.

In some exemplary implementation modes, the third connection line and the first power line are integrated. In the present exemplary implementation mode, the third connection line and the first power line are arranged integrally, so that wiring in the first border region may be optimized.

In some exemplary implementation modes, the signal connection line includes a third connection line and a fourth connection line. The third connection line is connected with the fourth connection line. The fourth connection line is connected with the first power line in the first border region. The fourth connection line is on a side of the first power line close to the underlay substrate. In some examples, the third connection line may be connected with the fourth connection line in the first border region, or, may be connected with the fourth connection line in the second border region. In some examples, the third connection line may be in the same layer as the first power line, for example, in the same layer as the source and drain metal layer in the display region, and the fourth connection line may be in the same layer as the second gate metal layer in the display region. However, no limits are made thereto in the present embodiment.

In some exemplary implementation modes, the pixel driving circuit includes a first transistor to a seventh transistor. A control electrode of the first transistor is connected with a second scanning line, a first electrode of the first transistor is connected with a second initial signal line, and a second electrode of the first transistor is connected with a first node. A control electrode of the second transistor is connected with a first scanning line, a first electrode of the second transistor is connected with the first node, and a second electrode of the second transistor is connected with a third node. A control electrode of the third transistor is connected with the first node, a first electrode of the third transistor is connected with a second node, and a second electrode of the third transistor is connected with the third node. A control electrode of the fourth transistor is connected with a first scanning signal line, a first electrode of the fourth transistor is connected with a data signal line, and a second electrode of the fourth transistor is connected with the second node. A control electrode of the fifth transistor is connected with a light emitting signal line, a first electrode of the fifth transistor is connected with a second power line, and a second electrode of the fifth transistor is connected with the second node. A control electrode of the sixth transistor is connected with the light emitting signal line, a first electrode of the sixth transistor is connected with the third node, and a second electrode of the sixth transistor is connected with a fourth node. A control electrode of the seventh transistor is connected with the first scanning signal line, a first electrode of the seventh transistor is connected with the first initial signal line, and a second electrode of the seventh transistor is connected with the fourth node. A first electrode of the light emitting element is connected with the fourth node, and a second electrode of the light emitting element is connected with the first power line.

The solution of the present embodiment will be described below with some examples.

FIG. 1 is a schematic diagram of a display substrate according to at least one embodiment of the present disclosure. As shown in FIG. 1, in a plane parallel to the display substrate, the display substrate includes a display region 100 and a peripheral region on a periphery of the display region 100. The peripheral region includes a first border region 200, a second border region 300, and a bonding pin region 400. The bonding pin region 400 is on one side of the display region 100. The first border region 200 is between the display region 100 and the bonding pin region 400. The second border region 300 is on another side of the display region 100. The second border region 300 is connected with the first border region 200 to surround the display region 100. In some examples, the first border region 200 is a lower border of the display substrate, and the second border region 300 includes an upper border, left border, and right border of the display substrate. However, no limits are made thereto in the present embodiment.

In some exemplary implementation modes, as shown in FIG. 1, the display substrate may include a pair of long edges that are parallel to each other in a first direction F1 and a pair of short edges that are parallel to each other in a second direction F2. The first direction F1 is perpendicular to the second direction F2. However, a shape of the display substrate is not limited in the present embodiment. In some examples, the display substrate may be a closed polygon including linear edges, a round or ellipse including a curved edge, a half round or semi-ellipse including a linear edge and a curved edge, or the like. In some examples, at least some corners of the display substrate may be curves when the display substrate has linear edges. An intersection of adjacent linear edges may be replaced with a curve with a predetermined curvature when the display substrate is rectangular. Herein, the curvature may be set according to different positions of curves. For example, the curvature may be changed according to a starting position of the curve, a length of the curve, etc.

In some exemplary implementation modes, as shown in FIG. 1, the first border region 200 is on one side of the display region 100. Along a direction away from the display region 100 (namely along the second direction F2), the first border region 200 may include a first fanout region 201, bending region 202, second fanout region 203, anti-static region 204, and driving chip region 205 which are arranged in sequence. The bonding pin region 400 is on a side of the driving chip region 205 away from the display region 100. A signal transmission line of the display substrate may be arranged in the first fanout region 201. The signal transmission line of the display substrate at least includes a first power line (VSS), a second power line (VDD), and multiple data transmission lines. The multiple data transmission lines are arranged to be connected with a data line of the display substrate in a fanout wiring manner. The first power line VSS and the second power line VDD are arranged to be connected with a low-level power line and high-level power line of the display substrate respectively. A groove may be formed in the bending region 202. The groove is arranged to bend the second fanout region 203, the anti-static region 204, the driving chip region 205, and the bonding pin region 400 to a back surface of the display region 100. The first power line VSS, the second power line VDD, a gate signal transmission line, and the multiple data transmission lines led out in the fanout wiring manner may be arranged in the second fanout region 203. An anti-static circuit may be arranged in the anti-static region 204. The anti-static circuit is arranged to eliminate static electricity. A source driving circuit (Driver IC) may be arranged in the driving chip region 205. The source driving circuit is arranged to be connected with the multiple data transmission lines in the second fanout region 203. Multiple pins may be arranged in the bonding pin region 400. The multiple pins are connected with the first power line VSS, the second power line VDD, a signal line in the anti-static region 204, and a signal line in the driving chip region 205. The multiple pins are connected with an external control device by bonding a Flexible Printed Circuit (FPC).

Figure 2:
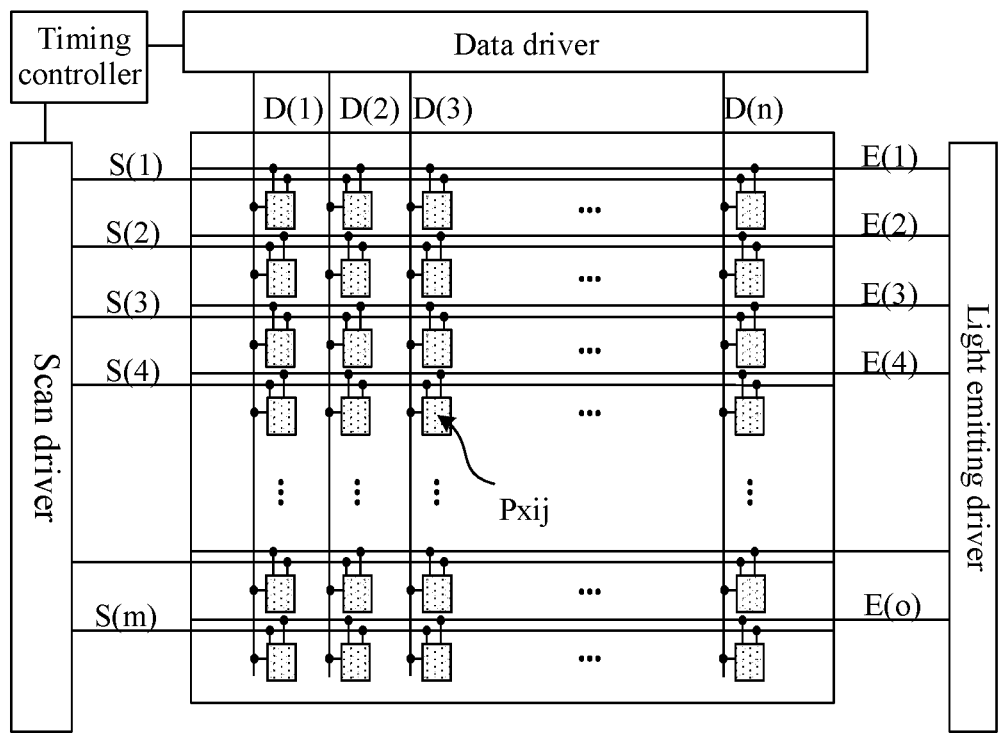
FIG. 2 is a schematic diagram of a driving structure of a display substrate according to at least one embodiment of the present disclosure.

FIG. 2 is a schematic diagram of a driving structure of a display substrate according to at least one embodiment of the present disclosure. As shown in FIG. 1 and FIG. 2, a pixel array is arranged in the display region of the display substrate, and a timing controller, a data driver, a scan driver, and a light emitting driver may be arranged in the peripheral region. The pixel array may include multiple scanning signal lines (for example, S(1) to S(m)), multiple data signal lines (for example, D(1) to D(n)), multiple light emitting signal lines (for example, E(1) to E(o)), and multiple sub-pixels Pxij.

In some exemplary implementation modes, the timing controller may provide a gray-scale value and control signal suitable for a specification of the data driver for the data driver, provide a clock signal, scan starting signal, etc., suitable for a specification of the scan driver, and provide a clock signal, transmission stopping signal, etc., suitable for a specification of the light emitting driver for the light emitting driver. The data driver may generate a data voltage to be provided to the data signal lines D(1) to D(n) using the gray-scale value and control signal received from the timing controller. For example, the data driver may sample the gray-scale value using the clock signal and apply the data voltage corresponding to the gray-scale value to the data signal lines D(1) to D(n) taking sub-pixel row as the unit. Herein, n may be a natural number. The scan driver may receive the clock signal, the scan starting signal, etc., from the timing controller to generate a scanning signal to be provided to the scanning signal lines S(1) to S(m). For example, the scan driver may sequentially provide a scanning signal with a turn-on level pulse to the scanning signal lines S(1) to S(m). For example, the scan driver may be in form of a shift register, and may sequentially transmit the scan starting signal provided in form of the turn-on level pulse to a next-stage circuit to generate the scanning signal under the control of the clock signal. Herein, m may be a natural number. The light emitting driver may receive the clock signal, the transmission stopping signal, etc., from the timing controller to generate a light emitting signal to be provided to the light emitting signal lines E(1) to E(o). For example, the light emitting driver may sequentially provide a light emitting signal with a cut-off level pulse to the light emitting lines E(1) to E(o). For example, the light emitting driver may be in form of a shift register, and may sequentially transmit the transmission stopping signal provided in form of the cut-off level pulse to a next-stage circuit to generate the light emitting signal under the control of the clock signal. Herein, o may be a natural number. The pixel array may include multiple sub-pixels PXij. Each sub-pixel PXij may be connected to the corresponding data signal line, the corresponding scanning signal line, and the corresponding light emitting signal line. Herein, i and j may be natural numbers. The sub-pixel PXij may refer to a sub-pixel of which a transistor is connected to an ith scanning signal line and a jth data signal line.

Figure 3:
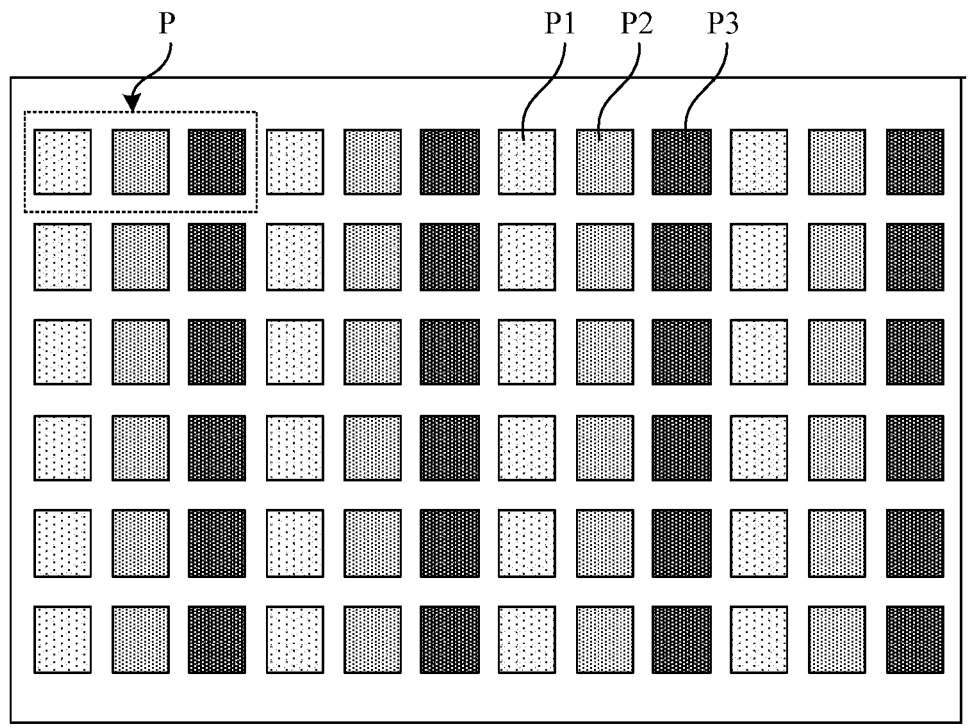
FIG. 3 is a schematic structural plan view of a display region of a display substrate according to at least one embodiment of the present disclosure.

FIG. 3 is a schematic structural plan view of a display region of a display substrate according to at least one embodiment of the present disclosure. As shown in FIG. 3, the display region of the display substrate may include multiple pixel units arranged in a matrix. At least one of the multiple pixel units P includes a first sub-pixel P1 that emits first-color light, a second sub-pixel P2 that emits second-color light, and a third sub-pixel P3 that emits third-color light. Each of the first sub-pixel P1, the second sub-pixel P2, and the third sub-pixel P3 includes a pixel driving circuit and a light emitting element. The pixel driving circuits in the first sub-pixel P1, the second sub-pixel P2, and the third sub-pixel P3 are connected with the scanning signal line, the data signal line, and the light emitting signal line respectively. The pixel driving circuit is arranged to, under the control of the scanning signal line and the light emitting signal line, receive a data voltage transmitted by the data signal line and output a corresponding current to the light emitting element. The light emitting elements in the first sub-pixel P1, the second sub-pixel P2, and the third sub-pixel P3 are connected with the pixel driving circuits of the corresponding sub-pixels respectively. The light emitting element is arranged to emit light of corresponding luminance responsive to the current output by the pixel driving circuit of the corresponding sub-pixel.

In some exemplary implementation modes, the pixel unit P may include a Red (R) sub-pixel, a Green (G) sub-pixel, and a Blue (B) sub-pixel, or may include a red sub-pixel, a green sub-pixel, a blue sub-pixel, and a white sub-pixel. No limits are made in the present disclosure. In some exemplary implementation modes, a shape of the sub-pixel in the pixel unit may be a rectangle, a rhombus, a pentagon, or a hexagon. When the pixel unit includes three sub-pixels, the three sub-pixels may be arranged in parallel in a horizontal direction, in parallel in a vertical direction, or in a Delta shape. When the pixel unit includes four sub-pixels, the four sub-pixels may be arranged in parallel in the horizontal direction, in parallel in the vertical direction, or in a square. However, no limits are made in the present disclosure.

Figure 4:
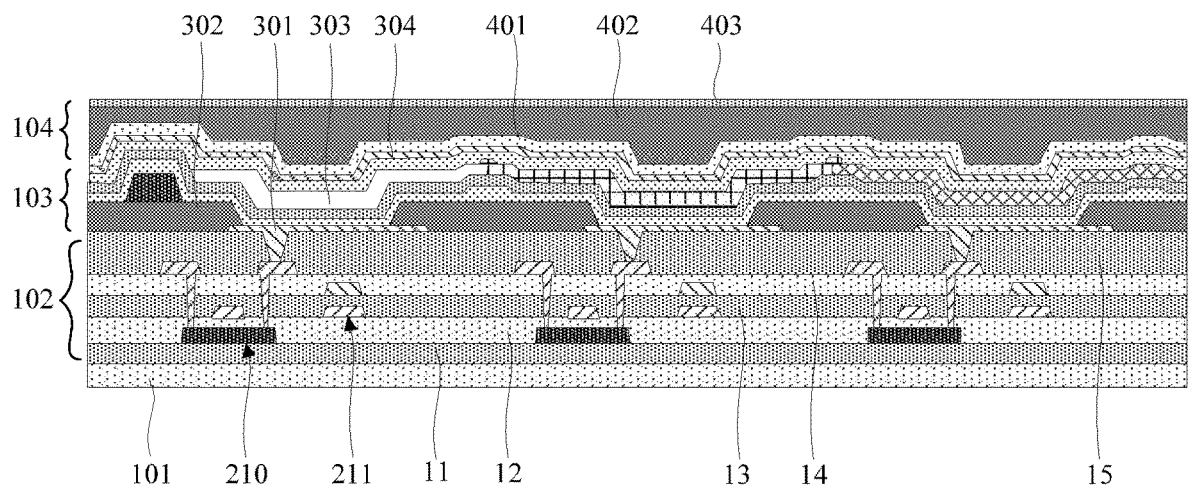
FIG. 4 is a schematic structural sectional view of a display region of a display substrate according to at least one embodiment of the present disclosure.

FIG. 4 is a schematic structural sectional view of a display region of a display substrate according to at least one embodiment of the present disclosure. FIG. 4 illustrates structures of three sub-pixels of the display substrate. As shown in FIG. 4, in a plane perpendicular to the display substrate, the display region may include a driving structure layer 102 arranged on an underlay substrate 101, a light emitting element 103 arranged on a side of the driving structure layer 102 away from the underlay substrate 101, and a package layer 104 arranged on a side of the light emitting element 103 away from the underlay substrate 101. In some possible implementation modes, the display region may include another film layer, such as a spacer column. No limits are made in the present disclosure.

In some exemplary implementation modes, the underlay substrate 101 may be a flexible base or a rigid base. The driving structure layer 102 of each sub-pixel may include multiple thin film transistors and memory capacitor that form a pixel driving circuit. FIG. 4 illustrates one thin film transistor 210 and one memory capacitor 211 in each sub-pixel as an example. The driving structure layer 102 includes a semiconductor layer, first gate metal layer, second gate metal layer, and source and drain metal layer which are arranged on the underlay substrate 101. The semiconductor layer at least includes an active layer of the thin film transistor 210. The first gate metal layer at least includes a gate of the thin film transistor and a first capacitor electrode of the memory capacitor. The second gate metal layer at least includes a second capacitor electrode of the memory capacitor. The source and drain metal layer at least includes a source electrode and drain electrode of the thin film transistor. A first insulating layer 11 is arranged between the underlay substrate and the semiconductor layer. A second insulating layer 12 is arranged between the semiconductor layer and the first gate metal layer. A third insulating layer 13 is arranged between the first gate metal layer and the second gate metal layer. A fourth insulating layer 14 is arranged between the second gate metal layer and the source and drain metal layer. A fifth insulating layer 15 is arranged between the source and drain metal layer and the light emitting element 103. The first insulating layer 11 may also be called a buffer layer. The second insulating layer 12 and the third insulating layer 13 may also be called gate insulating layers. The fourth insulating layer 14 may also be called an interlayer insulating layer. The fifth insulating layer 15 may also be called a flat layer.

In some exemplary implementation modes, the light emitting element 103 may include a first electrode 301, a pixel defining layer 302, an organic light emitting layer 303, and a second electrode 304. The first electrode 301 is connected with the drain electrode of the thin film transistor 210 through a via. The organic light emitting layer 303 is connected with the first electrode 301. The second electrode 304 is connected with the organic light emitting layer 303. The organic light emitting layer 303 is driven by the first electrode 301 and the second electrode 304 to emit light of a corresponding color. In some examples, the first electrode 301 is an anode, and the second electrode 304 is a cathode. The package layer 104 may include a first package layer 401, second package layer 402, and third package layer 403 which are stacked. An inorganic material may be adopted for the first package layer 401 and the third package layer 403. An organic material may be adopted for the second package layer 402. The second package layer 402 is arranged between the first package layer 401 and the third package layer 403. Steam may be prevented from entering the light emitting element 103 from the outside.

In some exemplary implementation modes, the organic light emitting layer 303 may include a Hole Injection Layer (HIL), Hole Transport Layer (HTL), Electron Block Layer (EBL), Emitting Layer (EVIL), Hole Block Layer (HBL), Electron Transport Layer (ETL), and Electron Injection Layer (EIL) which are stacked. In some examples, the hole injection layers and electron injection layers of all the sub-pixels may interconnected layers that are connected together, the hole transport layers and electron transport layers of all the sub-pixels may be interconnected layers that are connected together, the hole block layers of all the sub-pixels may be interconnected layers that are connected together, and the emitting layers and electron block layers of adjacent sub-pixels may overlap in small portion, or may be isolated. However, no limits are made thereto in the present embodiment.

Figure 5:
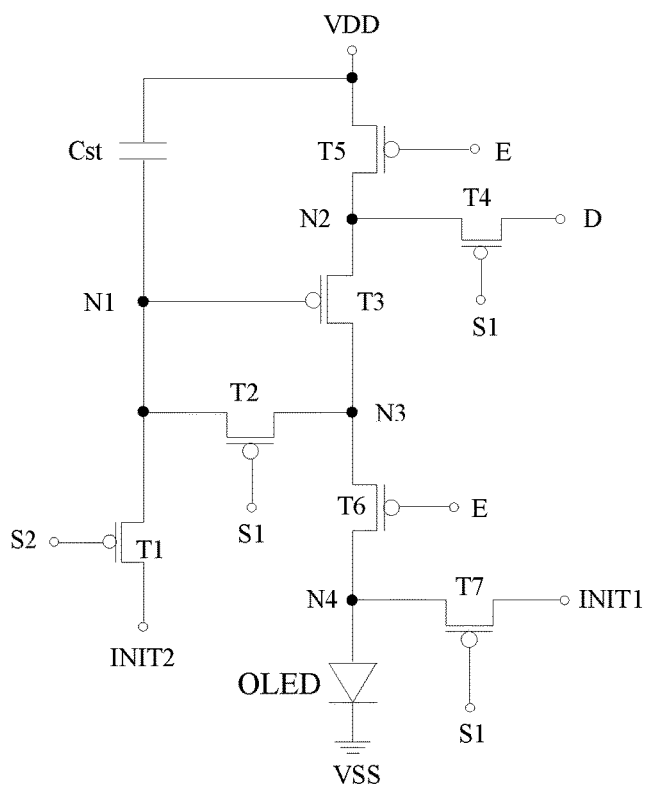
FIG. 5 is a schematic equivalent circuit diagram of a pixel driving circuit according to at least one embodiment of the present disclosure.

In some exemplary implementation modes, the pixel driving circuit may be of a 7T1C structure. FIG. 5 is a schematic equivalent circuit diagram of a pixel driving circuit according to at least one embodiment of the present disclosure. As shown in FIG. 5, the pixel driving circuit may include seven thin film transistors (a first transistor T1 to a seventh transistor T7), one memory capacitor Cst, and eight signal lines (a data signal line D, a first scanning signal line S1, a first scanning signal line S2, a light emitting signal line E, a first initial signal line INIT1, a second initial signal line INIT2, a first power line VSS, and a second power line VDD).

In some exemplary implementation modes, a first terminal of the memory capacitor Cst is connected with the second power line VDD, and a second terminal of the memory capacitor Cst is connected with a first node N1, namely the second terminal of the memory capacitor Cst is connected with a control electrode of the third transistor T3.

A control electrode of the first transistor T1 is connected with the second scanning signal line S2, a first electrode of the first transistor T1 is connected with the second initial signal line INIT2, and a second electrode of the first transistor is connected with the first node N1. When a tun-on level scanning signal is applied to the second scanning signal line S2, the first transistor T1 transmits a second initial voltage to the control electrode of the third transistor T3 to initialize the quantity of electric charges of the control electrode of the third transistor T3.

A control electrode of the second transistor T2 is connected with the first scanning signal line S1, a first electrode of the second transistor T2 is connected with the first node N1, and a second electrode of the second transistor T2 is connected with a third node N3. When a turn-on level scanning signal is applied to the first scanning signal line S1, the second transistor T2 connects the control electrode and second electrode of the third transistor T3.

The control electrode of the third transistor T3 is connected with the first node N1, namely the control electrode of the third transistor T3 is connected with the second terminal of the memory capacitor Cst, a first electrode of the third transistor T3 is connected with a second node N2, and a second electrode of the third transistor T3 is connected with the third node N3. The third transistor T3 may be called a driving transistor. The third transistor T3 determines a magnitude of a driving current that flows between the second power line VDD and the first power line VSS according to a potential difference between the control electrode and first electrode thereof.

A control electrode of the fourth transistor T4 is connected with the first scanning signal line S1, a first electrode of the fourth transistor T4 is connected with the data signal line D, and a second electrode of the fourth transistor T4 is connected with the second node N2. The fourth transistor T4 may be called a switch transistor, a scan transistor, etc. When the turn-on level scanning signal is applied to the first scanning signal line S1, the fourth transistor T4 inputs a data voltage of the data signal line D to the pixel driving circuit.

A control electrode of the fifth transistor T5 is connected with the light emitting signal line E, a first electrode of the fifth transistor T5 is connected with the second power line VDD, and a second electrode of the fifth transistor T5 is connected with the second node N2. A control electrode of the sixth transistor T6 is connected with the light emitting signal line E, a first electrode of the sixth transistor T6 is connected with the third node N3, and a second electrode of the sixth transistor T6 is connected with the first electrode of the light emitting element. The fifth transistor T5 and the sixth transistor T6 may be called light emitting transistors. When a tun-on level light emitting signal is applied to the light emitting signal line E, the fifth transistor T5 and the sixth transistor T6 form a driver current path between the second power line VDD and the first power line VSS to cause the light emitting element to emit light.

A control electrode of the seventh transistor T7 is connected with the first scanning signal line S1, a first electrode of the seventh transistor T7 is connected with the first initial signal line INIT1, and a second electrode of the seventh transistor T7 is connected with the first electrode of the light emitting element. When the turn-on level scanning signal is applied to the first scanning signal line S1, the seventh transistor T7 transmits a first initial voltage to the first electrode of the light emitting element to initialize the quantity of electric charges accumulated in the first electrode of the light emitting element or release the electric charges accumulated in the first electrode of the light emitting element.

In some exemplary implementation modes, the second electrode of the light emitting element is connected with the first power line VSS. A signal of the first power line VSS is a low-level signal. A signal of the second power line VDD is a signal that keeps providing a high level. The first scanning signal line S1 is a scanning signal line in the pixel driving circuit of a present display row, and the second scanning signal line S2 is a scanning signal line in the pixel driving circuit of a previous display row. That is, for an nth display row, the first scanning signal line S1 is S(n), and the second scanning signal line S2 is S(n-1). The second scanning signal line S2 of the present display row and the first scanning signal line S1 in the pixel driving circuit of the previous display row are the same signal line. Signal lines of a display panel may be reduced, and the display panel has a narrow border.

In some exemplary implementation modes, the first transistor T1 to the seventh transistor T7 may be P-type transistors, or may be N-type transistors. Adopting the same type of transistors in the pixel driving circuit may simplify the process flow, reduce the process difficulties of the display panel, and improve the yield of the product. In some possible implementation modes, the first transistor T1 to the seventh transistor T7 may include P-type transistors and N-type transistors.

In some exemplary implementation modes, the first scanning signal line S1, the second scanning signal line S2, the light emitting signal line E, the first initial signal line INIT1, and the second initial signal line INIT2 may extend in the first direction F1 in the display region. The second power line VDD and the data signal line D may extend in the second direction F2.

Figure 6:
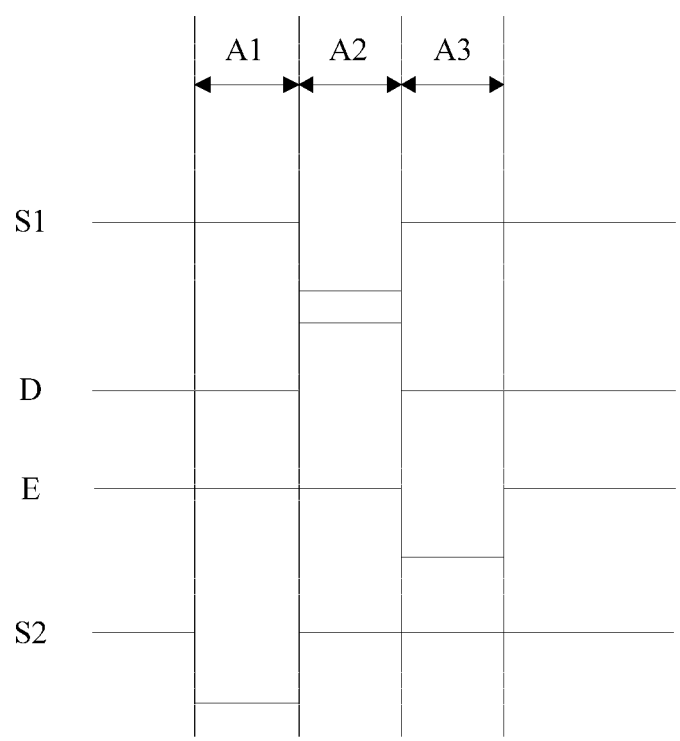
FIG. 6 is a working sequence diagram of a pixel driving circuit according to at least one embodiment of the present disclosure.

FIG. 6 is a working sequence diagram of a pixel driving circuit according to at least one embodiment of the present disclosure. The exemplary embodiment of the present disclosure will be described below through a working process of the pixel driving circuit shown in FIG. 5. In FIG. 5, the pixel driving circuit includes seven thin film transistors (a first transistor T1 to a seventh transistor T7), one memory capacitor Cst, and eight signal lines (a data signal line D, a first scanning signal line S1, a first scanning signal line S2, a light emitting signal line E, a first initial signal line INIT1, a second initial signal line INIT2, a first power line VSS, and a second power line VDD). All the seven transistors are P-type transistors.

In some exemplary implementation modes, the working process of the pixel driving circuit may include the following stages.

In a first stage A1, called a reset stage, a signal of the second scanning signal line S2 is a low-level signal, and signals of the first scanning signal line S1 and the light emitting signal line E are high-level signals. The signal of the second scanning signal line S2 is a low-level signal, so that the first transistor T1 is turned on, and a signal of the second initial signal line INIT2 is provided to the first node N1 to initialize the memory capacitor Cst and clear an original data voltage in the memory capacitor Cst. The signals of the first scanning signal line S1 and the light emitting signal line E are high-level signals, so that the second transistor T2, the fourth transistor T4, the fifth transistor T5, the sixth transistor T6, and the seventh transistor T7 are turned off. The light emitting element does not emit light in the present stage.

In a second stage A2, called a data write stage or a threshold compensation stage, the signal of the first scanning signal line S1 is a low-level signal, the signals of the second scanning signal line S2 and the light emitting signal line E are high-level signals, and the data signal line D outputs a data voltage. In the present stage, the second terminal of the memory capacitor Cst is a low level, so that the third transistor T3 is turned on. The signal of the first scanning signal line S1 is a low-level signal, so that the second transistor T2, the fourth transistor T4, and the seventh transistor T7 are turned on. The second transistor T2 and the fourth transistor T4 are turned on, so that the data voltage output by the data signal line D is provided to the first node N1 through the second node N2, the turned-on third transistor T3, the third node N3, and the turned-on second transistor T2, and the memory capacitor Cst is charged with a difference between the data voltage output by the data signal line D and a threshold voltage of the third transistor T3. A voltage of the second terminal (the first node N1) of the memory capacitor Cst is Vd−|Vth|, where Vd the data voltage output by the data signal line D, and Vth is the threshold voltage of the third transistor T3. The seventh transistor T7 is turned on, so that the first initial voltage of the first initial signal line INIT1 is provided to the first electrode of the light emitting element to initialize (reset) the first electrode of the light emitting element and clear a pre-stored voltage therein to complete initialization to ensure that the light emitting element does not emit light. The signal of the second scanning signal line S2 is a high-level signal, so that the first transistor T1 is turned off. The signal of the light emitting signal line E is a high-level signal, so that the fifth transistor T5 and the sixth transistor T6 are turned off.

In a third stage A3, called a light emitting stage, the signal of the light emitting signal line E is a low-level signal, and the signals of the first scanning signal line S1 and the second scanning signal line S2 are high-level signals. The signal of the light emitting signal line E is a low-level signal, so that the fifth transistor T5 and the sixth transistor T6 are turned on, and a power voltage output by the second power line VDD provides a driving voltage to the first electrode of the light emitting element through the fifth transistor T5, third transistor T3, and sixth transistor T6 which are turned on to drive the light emitting element to emit light.

In a driving process of the pixel driving circuit, the driving current flowing through the third transistor T3 (driving transistor) is determined by a voltage difference between the gate electrode and first electrode thereof. Since the voltage of the second node N2 is Vdata-jVthj, the driving current of the third transistor T3 is:

$$I=K*(Vgs-Vth)^2=K*[(Vdd-Vd+|Vth|)-Vth]^2=K*[Vdd-Vd]^2.$$

Herein, I is the driving current flowing through the third transistor T3, i.e., the driving current for driving the light emitting element, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the second power line VDD.

In the present exemplary implementation mode, the voltages of the first node N1 and the fourth node N4 are controlled by the second initial signal line INIT2 and the first initial signal line INIT1 respectively. The first initial voltage provided by the first initial signal line INIT1 is different from the second initial voltage provided by the second initial signal line INIT2. The first initial signal line INIT1 is connected with the first power line VSS, namely the first initial voltage provided by the first initial signal line INIT1 is equal to the first power voltage provided by the first power line VSS.

In the present embodiment, double initial signal lines are adopted to provide different initial voltages for the first node N1 and the fourth node N4 respectively, so that problems existing when the first node and the fourth node are controlled through the same initial signal line may be solved, for example, a luminance difference of the display region caused by a drop of the same initial signal line close to the first border region and away from the first border region, or the problem that the image quality under a low gray-scale is affected by a drop of the same initial signal line at an open region and a side of the open region close to the first border region when the display region includes the open region. In the present exemplary implementation mode, the first initial signal line INIT1 is arranged and connected with the first power line VSS, and the first power line VSS may be used to provide the first initial voltage, thereby avoiding the addition of a pin for introducing the first initial voltage in the bonding pin region and avoiding the enlargement of the area of the first border region by addition of the wiring space for introducing the first initial voltage in the first border region.

Figure 7:
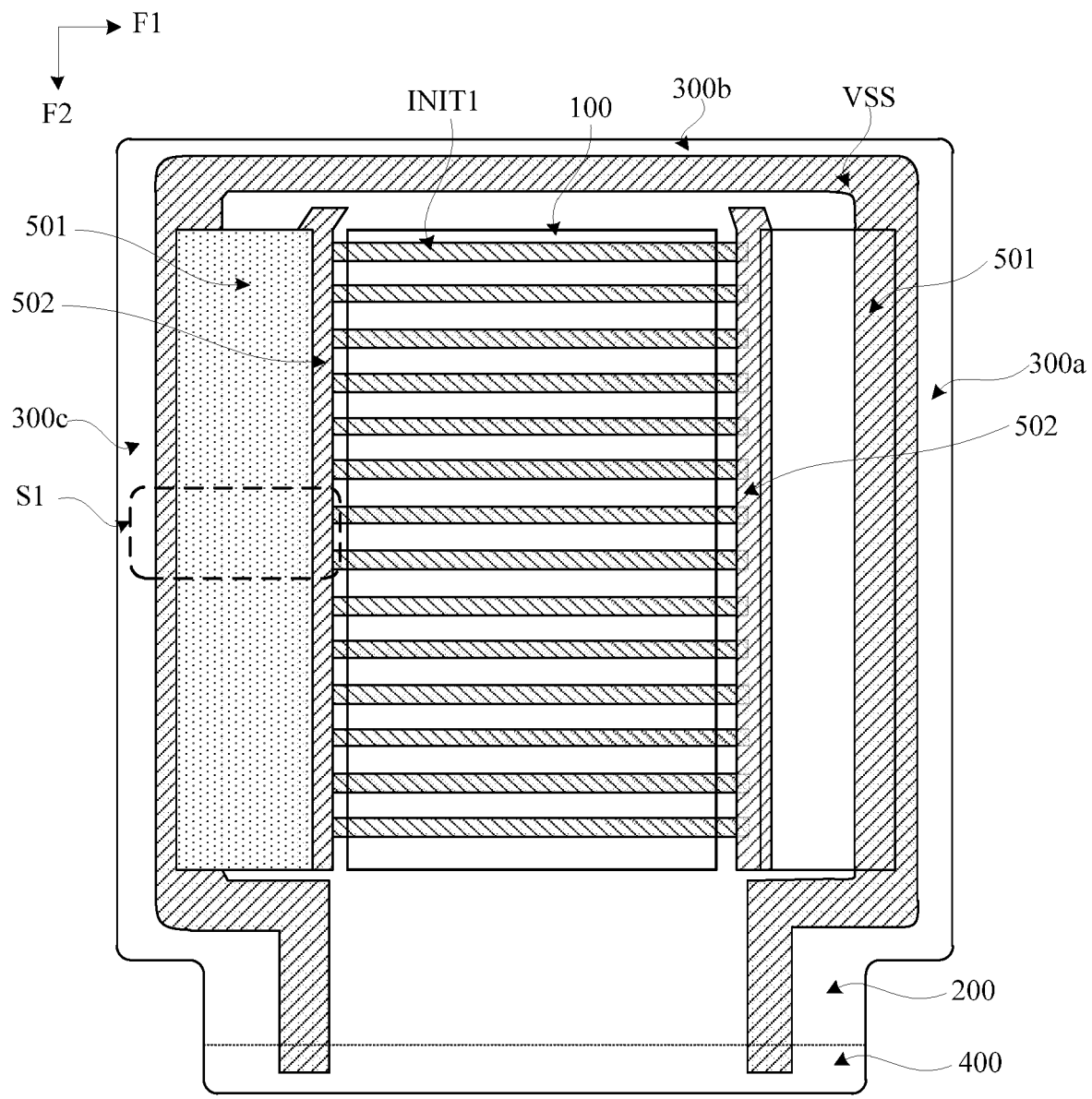
FIG. 7 is a schematic wiring diagram of a peripheral region of a display substrate according to at least one embodiment of the present disclosure.

FIG. 7 is a schematic wiring diagram of a peripheral region of a display substrate according to at least one embodiment of the present disclosure. As shown in FIG. 1 and FIG. 7, the second border region 300 includes a first edge region 300a on a right side of the display region 100, a second edge region 300b on an upper side of the display region 100, and a third edge region 300c on a left side of the display region 100. The first edge region 300a, the second edge region 300b, the third edge region 300c, and the first border region 200 are connected to surround the display region 100. For example, the first edge region 300a may be the right border of the display substrate, the second edge region 300b may be the upper border of the display substrate, and the third edge region 300c may be the left border of the display substrate.

In some exemplary implementation modes, multiple parallel first initial signal lines INIT1 are arranged in the display region 100. Each first initial signal line INIT1 is arranged to provide a first initial voltage to the pixel driving circuit of a sub-pixel in each row. For example, the multiple first initial signal lines INIT1 in the display region 100 may extend in the first direction F1, and are sequentially arranged in the second direction F2. In some examples, taking the pixel driving circuit shown in FIG. 5 as an example, in each sub-pixel, all the first scanning signal line S1, the second scanning signal line S2, the first initial signal line INIT1, the second initial signal line INIT2, and the light emitting signal line E extend in the first direction fl, the data signal line D and the second power line VDD extend in the second direction F2, and the first scanning signal line S1, the light emitting signal line E, the second initial signal line INIT2, the first initial signal line INIT1, and the second scanning signal line S2 may be sequentially arranged in the second direction F2. However, no limits are made thereto in the present embodiment.

In some exemplary implementation modes, the first initial signal line INIT1 may extend from the display region 100 to the first edge region 300a and third edge region 300c of the second border region 300. For example, the first initial signal line INIT1 has a first extending terminal that extends to the first edge region 300a and a second extending terminal that extends to the third edge region 300c. However, no limits are made thereto in the present embodiment. For example, the first initial signal line INIT1 may extend to the edge region of one side to receive the first initial voltage.

In some exemplary implementation modes, the first power line VSS, a first connection line 501, and a second connection line 502 are arranged in the second border region 300. In some examples, the first power line VSS may be arranged in the first edge region 300a, the second edge region 300b, and the third edge region 300c, and the first connection line 501 and the second connection line 502 may be arranged in the first edge region 300a and the third edge region 300c. The first connection line 501 is connected with the multiple first initial signal lines INIT1 in the display region 100 through the second connection line 502, and the first connection line 501 is connected with the first power line VSS, thereby electrically connecting the first power line VSS with the first initial signal line INIT1 in the display region 100. The first connection line 501 is on a side of the second connection line 502 away from the display region 100. The first power line VSS is on a side of the first connection line 501 away from the display region 100. In some examples, the second connection line 502 may be in the same layer as the first power line VSS, and the first connection line 501 is on a side of the first power line VSS away from the underlay substrate. However, no limits are made thereto in the present embodiment.

In some exemplary implementation modes, the first power line VSS is connected with a pin in the bonding pin region 400 to acquire the externally provided first power voltage. The first power line VSS is arranged on the periphery of the display region 100 in the first edge region 300a, the second edge region 300b, and the third edge region 300c.

In some exemplary implementation modes, the first connection line 501 and the second connection line 502 are arranged in both the first edge region 300a and the third edge region 300c. The first extending terminals of the multiple first initial signal lines INIT1 are connected with the first power line VSS through the second connection line 502 and the first connection line 501 in the first edge region 300a. The second extending terminals of the multiple first initial signal lines INIT1 are connected with the first power line VSS through the second connection line 502 and the first connection line 501 in the third edge region 300c. However, no limits are made thereto in the present embodiment. For example, the first connection line and the second connection line may be arranged in the first edge region 300a or the third edge region 300c only to connect the first initial signal line INIT1 with the first power line VSS.

In some exemplary implementation modes, the first connection line 501 and second connection line 502 in the second border region 300 may extend along an edge of the display region 100. For example, the first connection line 501 and second connection line 502 in the first edge region 300a and the third edge region 300c may extend in the second direction F2. The first connection 501 is directly connected with the first power line VSS. An orthographic projection of the first connection line 501 on the underlay substrate partially overlaps the first power line VSS. The second connection line 502 is connected with the first connection line 501 and the multiple first initial signal lines INIT1. In some examples, the first connection line 501 may be in the same layer as the first electrode of the light emitting element in the display region 100. The first power line VSS may be in the same layer as the source and drain metal layer in the display region 100. The second connection line 502 is in the same layer as the first power line VSS. The first initial signal line INIT2 is in the same layer as the second gate metal layer in the display region 100. However, no limits are made thereto in the present embodiment.

In the present exemplary implementation mode, the first power line VSS and the first initial signal line INIT1 are connected in the second border region 300 through the first connection line 501 and the second connection line 502 without adding any pin for introducing the first initial voltage in the bonding pin region 400 and adding a wiring space for introducing the first initial voltage in the first border region 200, so that enlargement of the areas of the first border region 200 and the bonding pin region 400 may be avoided.

Figure 8:
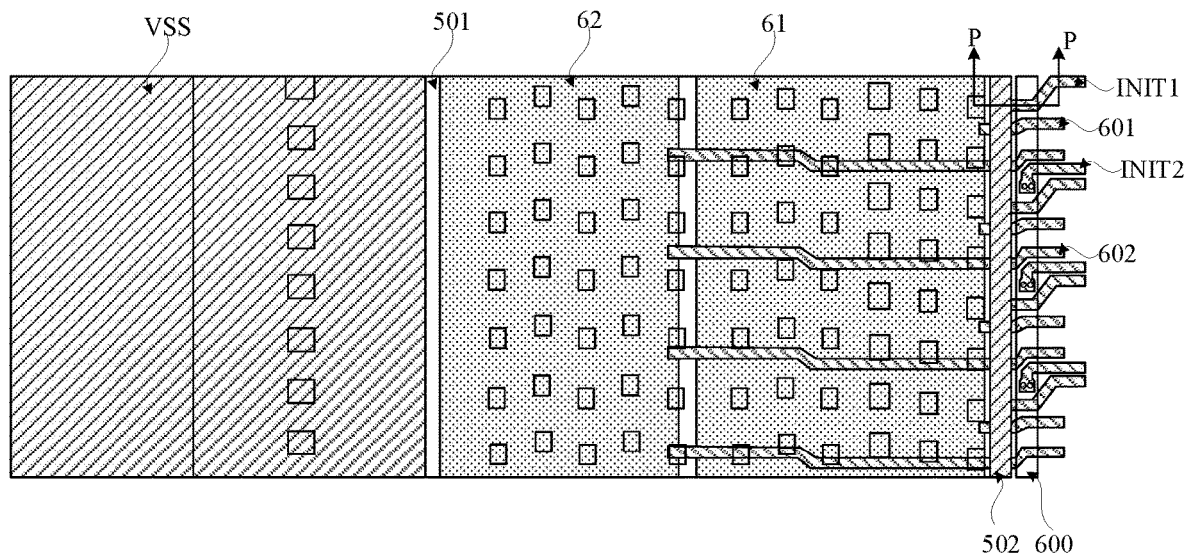
FIG. 8 and FIG. 9 are schematic partial enlarged views of region S1 in FIG. 7.
Figure 9:
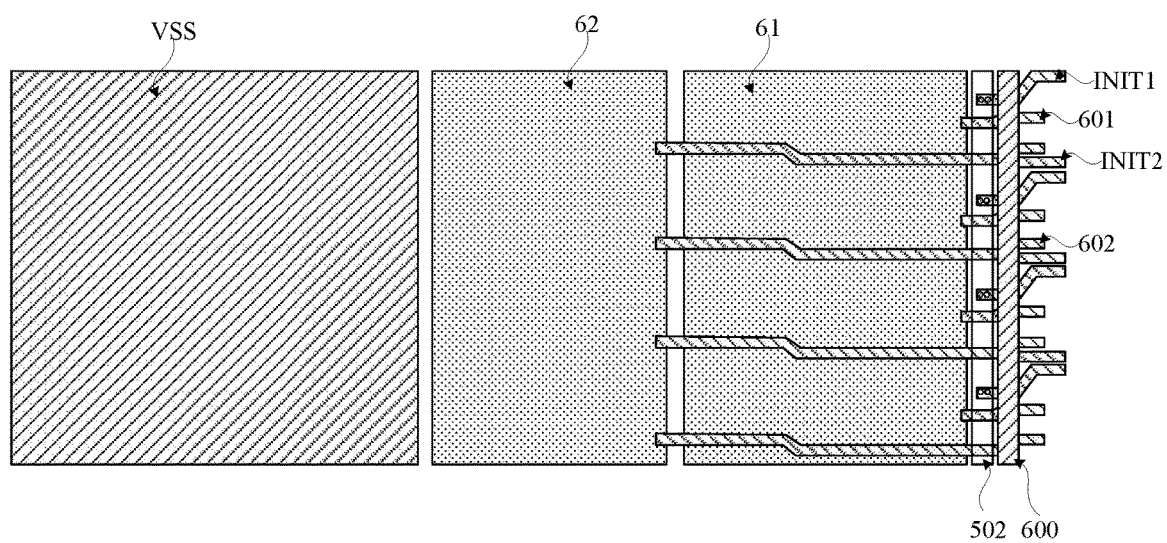

FIG. 8 and FIG. 9 are schematic partial enlarged views of region S1 in FIG. 7. FIG. 8 is a partial schematic diagram of a third edge region after formation of a first connection line according to at least one embodiment of the present disclosure. FIG. 9 is a partial schematic diagram of a third edge region after formation of a second connection line according to at least one embodiment of the present disclosure. FIG. 8 and FIG. 9 only illustrate the positions of a light emitting driving circuit and a scan driving circuit and omit detailed circuit structures.

In some exemplary implementation modes, as shown in FIG. 8 and FIG. 9, in a plane parallel to the display substrate, a first power line VSS, a light emitting driving circuit 62, a scan driving circuit 61, a second connection line 502, and an initial signal lead 600 are sequentially arranged in the third edge region 300c in a direction close to the display region 100. The initial signal lead 600 is connected with extending terminals of multiple second initial signal lines INIT2 in the third edge region 300c. The initial signal lead 600 is connected with a bonding pin in the bonding pin region 400 to acquire the externally provided second initial voltage. Extending directions of the second connection line 502 and the initial signal lead 600 are the same in the third edge region 300c. For example, they extend in the second direction F2. The second connection line 502 is on a side of the initial signal lead 600 away from the display region 100. However, no limits are made thereto in the present embodiment. For example, the second connection line 502 may be on a side of the initial signal lead 600 close to the display region 100.

In some exemplary implementation modes, a wiring width of the second connection line 502 may substantially be the same as a wiring width of the initial signal lead 600. A wiring width of the first power line VSS may be larger than the wiring width of the second connection 502 and the wiring width of the initial signal lead 600.

In some exemplary implementation modes, the wiring width of the second connection line 502 is about 3 um to 30 um, for example, about 13 um. The wiring width of the initial signal lead 600 is about 3 um to 30 um, for example, about 13 um. A distance between the second connection line 502 and the initial signal lead 600 is about 1 um to 15 um, for example, about 4 um. A wiring width of the first power line VSS in the third edge region 300c is about 20 um to 500 um, for example, about 270 um.

In the present disclosure, the wiring width represents a feature size of wiring in a direction perpendicular to the extending direction.

In some exemplary implementation modes, the scan driver may include a scan driving circuit 61 arranged in the first edge region 300a and the third edge region 300c respectively. The light emitting driver may include a light emitting driving circuit 62 arranged in the first edge region 300a and the third edge region 300c respectively. The scan driving circuit 61 may include multiple cascaded scan Gate On Array (GOA) units. The multiple scan GOA units may provide scanning signals (for example, including a first scanning signal and a second scanning signal) to the pixel array in the display region 100. In some examples, each scan GOA unit may be connected with the first scanning signal lines of sub-pixels in a row in the display region 100 through a scanning lead 601 to provide the first scanning signal to the sub-pixels in the row, and is connected with the second scanning signal lines of sub-pixels in a previous row to provide the second scanning signal to the sub-pixels in the previous row. The light emitting driving circuit may include multiple cascaded light emitting GOA units. The multiple light emitting GOA units may provide light emitting signals to the display region 100. Each light emitting GOA unit is connected with the light emitting signal lines of sub-pixels in a row in the display region through a light emitting lead 602 to provide a light emitting signal to the sub-pixels in the row.

In some exemplary implementation modes, the second connection line 502, the initial signal lead 600, and the first power line VSS may be in the same layer, for example, in the same layer as the source and drain metal layer in the display region 100. The multiple first initial signal lines INIT1 connected with the second connection line 502, the multiple second initial signal lines INIT2 connected with the initial signal lead 600, a scanning lead 601, and a light emitting lead 602 may be in the same layer, for example, in the same layer as the second gate metal layer in the display region 100. The first scanning signal line and second scanning signaling connected with the scanning lead 601 and the light emitting signal line connected with the light emitting lead 602 are in the same layer, for example, in the same layer as the first gate metal layer in the display region 100. The scanning lead 601 may be connected with the first scanning signal line and the second scanning signal line through a via in the second insulating layer. The light emitting lead 602 may be connected with the light emitting signal line through a via in the second insulating layer. However, no limits are made thereto in the present embodiment.

In some exemplary implementation modes, as shown in FIG. 8, the first connection line 501 may be provided with multiple hollow portions such that gaps are formed in the first connection line 501. In the present example, the multiple hollow portions are formed in the first connection line 501, so that bulges caused by the fact that the first connection line covers a large area of the fifth insulating layer (prepared from an organic insulating material) may be avoided. In an overlapping region of orthographic projections of the first connection line 501 and the first power line VSS on the underlay substrate, the positions of the multiple hollow portions of the first connection line 501 correspond to the position of a first barrier. The overlapping region of the first connection line 501 and the first power line VSS covers the position of the first barrier, so that the contact area of the first connection line 501 and the first power line VSS may be enlarged. The hollow portions are formed in the first connection line corresponding to the position of the first barrier, so that the first connection line 501 and the first power line VSS may be connected effectively.

In some exemplary implementation modes, the second connection line 501 is in the same layer as the first electrode of the light emitting element in the display region 100. The first power line VSS is in the same layer as the source and drain metal layer in the display region 100. A flat layer (i.e., the abovementioned fifth insulating layer) is arranged between the first power line VSS and the first connection line 501. The first power line VSS and the first connection line 501 may be connected effectively through a first groove formed in the flat layer.

Figure 10:
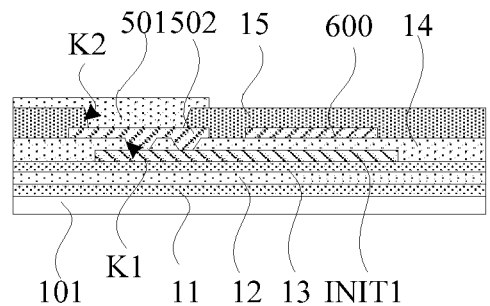
FIG. 10 is a schematic partial sectional view along P-P in FIG. 8.

FIG. 10 is a schematic partial sectional view along P-P in FIG. 8. In some exemplary implementation modes, as shown in FIG. 10, the first initial signal line INIT1 is arranged on the third insulating layer 13. The second connection line 502 is connected with the first initial signal line INIT1 through a first via K1 formed in the fourth insulating layer 14. The first connection line 501 is connected with the second connection line 502 through a second groove K2 formed in the fifth insulating layer 15.

In some examples, a first groove and a second groove are formed in the fifth insulating layer 15 of the peripheral region. The first connection line 501 may be connected with the first power line VSS through the first groove and connected with the second connection line 502 through the second groove. The first groove and the second groove are formed in the fifth insulating layer 15, so that the contact area of the first connection line 501 and each of the first power line VSS and the second connection line 502 may be enlarged, and the two terminals of the first connection line 501 may be electrically connected effectively with the first power line VSS and the second connection line 502 respectively.

Figure 11:
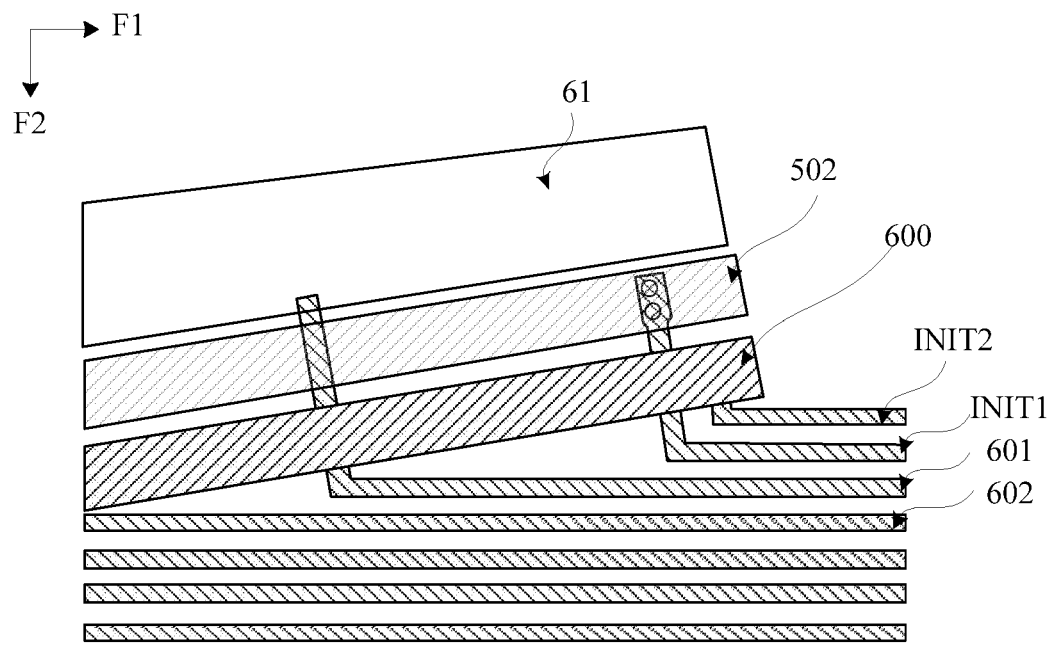
FIG. 11 is a partial schematic diagram of a top-left corner position of the display substrate shown in FIG. 7.

FIG. 11 is a partial schematic diagram of a top-left corner position of the display substrate shown in FIG. 7. FIG. 11 is a partial schematic diagram of a junction position of the second edge region 300b and third edge region 300c shown in FIG. 7. As shown in FIG. 7 and FIG. 11, the first connection line 501 and the second connection line 502 are not arranged in the second edge region 300b. The first initial signal line INIT1 extends from the left and right sides of the display region 100 to be connected with the first power line VSS. The second connection line 502 in the third edge region 300c may extend along an edge of a top-left corner of the display region 100. For example, the extending direction of the second connection line 502 at the top-left corner intersects with the extending direction of the second connection line 502 in the third edge region 300c. In some examples, the first connection line 501 may not need to extend to the top-left corner position. Since the second connection line 502 is connected with the first connection line 501 in the third edge region 300c, only the second connection line 502 extends to the top-left corner position to be connected with the first initial signal line INIT1.

A wiring structure at the junction position (i.e., the top-left corner position) of the second edge region and the first edge region may refer to FIG. 11, and thus will not be elaborated herein.

Figure 12:
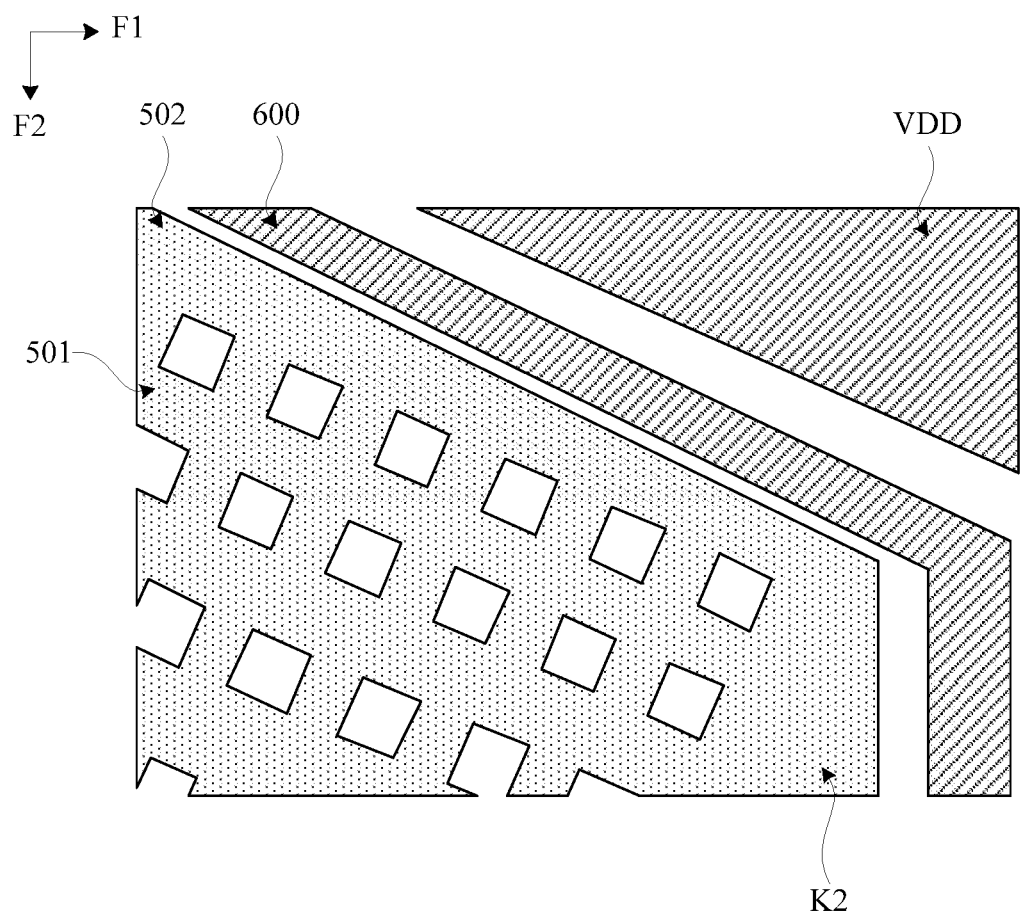
FIG. 12 is a partial schematic diagram of a bottom-left corner position of the display substrate shown in FIG. 7.

FIG. 12 is a partial schematic diagram of a bottom-left corner position of the display substrate shown in FIG. 7. FIG. 12 is a partial schematic diagram of a junction position of the third edge region and first border region 300c shown in FIG. 7. As shown in FIG. 7 and FIG. 12, the second connection line 502 may extend from the first border region 200 to the third edge region 300c. No pin connected with the second connection line 502 is required to be arranged in the bonding pin region. The initial signal lead 600 and the second power line VDD are arranged on a side of the second connection line 502 close to the display region 100. The initial signal lead 600 may extend from the bonding pin region 400 to the first edge region 300c through the first border region 200. The first connection line 501 may extend to the bottom-left corner position to be connected with the second connection line 502.

A wiring structure at the junction position (i.e., the bottom-left corner position) of the first edge region and the first border region may refer to FIG. 12, and thus will not be elaborated herein.

The structure of the display substrate of the present disclosure will be described below with reference to FIG. 4, and FIG. 8 to FIG. 12 through an example of a preparation process of the display substrate. A "patterning process" mentioned in the present disclosure includes film layer deposition, coating with a photoresist, masking, exposure, development, etching, photoresist stripping, and other treatment. Deposition may be any one or more of sputtering, evaporation, and chemical vapor deposition. Coating may be any one or more of spray coating and spin coating. Etching may be any one or more of dry etching and wet etching. "Thin film" refers to a layer of thin film made from a certain material on a base by a deposition or coating process. If the patterning process is not needed by the "thin film" in the whole making process, the "thin film" may also be called a "layer". When the patterning process is further needed by the "thin film" in the whole making process, the thin film is called a "thin film" before the patterning process and called a "layer" after the patterning process. The "layer" after the patterning process includes at least one "pattern".

"A and B are in the same layer" mentioned in the present disclosure refers to that A and B are simultaneously formed by the same patterning process. "The same layer" does not always mean that the thickness of the layer or the height of the layer is the same in the sectional view. "The orthographic projection of A includes the orthographic projection of B" refers to that the orthographic projection of B falls in a range of the orthographic projection of A or the orthographic projection of A covers the orthographic projection of B.

In some exemplary implementation modes, the preparation process of the display substrate of the present embodiment may include the following Step (1) to Step (8).

In (1), an underlay substrate is provided.

In some exemplary implementation modes, the underlay substrate 101 is a rigid substrate such as a glass substrate, or a flexible substrate. However, no limits are made thereto in the present embodiment.

In (2), a pattern of a semiconductor layer is prepared on the underlay substrate.

In some exemplary implementation modes, a first insulating thin film and a semiconductor thin film are sequentially deposited on the underlay substrate 101. The semiconductor thin film is patterned through the patterning process to form a first insulating layer 11 covering the whole underlay substrate 101 and the pattern of the semiconductor layer arranged on the first insulating layer 11. As shown in FIG. 4, the pattern of the semiconductor layer is formed in a display region 100, and at least includes a first active layer.

In (3), a pattern of a first gate metal layer is prepared on the underlay substrate.

In some exemplary implementation modes, a second insulating thin film and a first metal thin film are sequentially deposited on the underlay substrate 101. The first metal thin film is patterned through the patterning process to form a second insulating layer 12 covering the pattern of the semiconductor layer and the first gate metal layer arranged on the second insulating layer 12, as shown in FIG. 4. The pattern of the first gate metal layer is formed in the display region 100, and at least includes a first gate electrode and a first capacitor electrode. In the present step, a first scanning signal line, a second scanning signal line, and a light emitting signal line may be synchronously formed in the display region 100.

In (4), patterns of a second gate metal layer, a first initial signal line, and a second initial signal line are prepared on the underlay substrate.

In some exemplary implementation modes, a third insulating thin film and a second metal thin film are sequentially deposited on the underlay substrate 101 where the abovementioned structures are formed. The second metal thin film is patterned through the patterning process to form a third insulating layer 13, as well as the patterns of the second gate metal layer, the first initial signal line, and the second initial signal line which are arranged on the third insulating layer 13. As shown in FIG. 4, the pattern of the second gate metal layer is formed in the display region 100, and at least includes a second capacitor electrode. The first initial signal line INIT1 and the second initial signal line INIT2 may extend from the display region 100 to a first edge region 300a and a third edge region 300c.

In (5), a pattern of a fourth insulating layer is prepared on the underlay substrate.

In some exemplary implementation modes, a fourth insulating thin film is deposited on the underlay substrate 101 where the abovementioned structures are formed. The fourth insulating thin film is patterned through the patterning process to form the pattern of the fourth insulating layer 14 covering the patterns of the second gate metal layer, the first initial signal line, and the second initial signal line. As shown in FIG. 4 and FIG. 10, at least multiple first vias and multiple second vias are formed in the fourth insulating layer 14. The multiple second vias are in the display region 100 and expose the surface of the first active layer. The multiple first vias K1 are in the first edge region 300a and the third edge region 300c and expose the surfaces of the first initial signal line INIT1 and the second initial signal line INIT2.

In (6), patterns of a source and drain metal layer, a first power line, a second connection line, and an initial signal lead are prepared on the underlay substrate.

In some exemplary implementation modes, a third insulating thin film is deposited on the underlay substrate 101 where the abovementioned structures are formed. The third insulating thin film is patterned through the patterning process to form the patterns of the source and drain metal layer, the first power line VSS, the second connection line 502, and the initial signal lead 600 on the fourth insulating layer 14. As shown in FIG. 4, the pattern of the source and drain metal layer is formed in the display region 100, and at least includes patterns of a first source electrode, a first drain electrode, and multiple data lines (not shown). The first source electrode and the first drain electrode are connected with a source region and drain region of the first active layer through the second vias respectively. As shown in FIG. 8 to FIG. 10, the first power line VSS and the second connection line 502 are formed in the peripheral region. The second connection line 502 may be connected with the first initial signal line INIT1 through the first via K1. The initial signal lead 600 may be connected with the second initial signal line INIT2 through the first via K1.

At this moment, preparation of a driving structure layer in the display region 100 on the underlay substrate 101 is completed, as shown in FIG. 4. In the driving structure layer in the display region 100, the first active layer, the first gate electrode, the first source electrode, and the first drain electrode form a thin film transistor 210, and the first capacitor electrode and the second capacitor electrode form a memory capacitor 211.

In some exemplary implementation modes, each of the first insulating thin film to the fourth insulating thin film are made of an inorganic material, e.g., any one or more of silicon oxide (SiOx), silicon nitride (SiNx), and silicon oxynitride (SiON), and may be single-layer, multilayer, or composite.

In (7), a fifth insulating layer, a light emitting element, and a package layer are sequentially prepared on the underlay substrate.

In some exemplary implementation modes, the underlay substrate 101 where the abovementioned structures are formed is coated with a flat thin film, and the fifth insulating layer is formed through the patterning process. Multiple third vias, first grooves, and second grooves are formed in the fifth insulating layer. As shown in FIG. 4, the third via is formed in the display region 100 and exposes the surface of the first drain electrode of the thin film transistor 210. As shown in FIG. 8 and FIG. 10, the first groove and the second groove K2 are formed in a peripheral region. The fifth insulating layer 15 in the first groove is etched away to expose the surface of the first power line VSS. The fifth insulating layer in the second groove K2 is etched away to expose the surface of the second connection line 502.

Afterwards, a first conductive thin film is deposited, and the first conductive thin film is patterned through the patterning process to form patterns of a first electrode of the light emitting element and a first connection line 501. As shown in FIG. 4, the first electrode 301 of the light emitting element is formed in the display region 100, and the first electrode 301 is connected with the first drain electrode of the thin film transistor 210 through the third via in the fifth insulating layer 15. As shown in FIG. 8 and FIG. 10, the first connection line 501 is formed in the peripheral region, connected with the first power line VSS through the first groove, and connected with the second connection line 502 through the second groove K2.

Afterwards, coating with a pixel defining thin film is performed, and a pattern of a pixel defining layer 302 is formed by masking, exposure and development processes. As shown in FIG. 4, the pixel defining layer 302 is formed in the display region 100. A pixel opening is formed in the pixel defining layer 302 in the display region 100. The pixel defining thin film in the pixel opening is removed by development to expose the surface of the first electrode 301.

Afterwards, an organic light emitting layer 303 and a second electrode 304 are sequentially formed on the underlay substrate 101 where the abovementioned structures are formed. For example, the organic light emitting layer 303 includes a hole injection layer, hole transport layer, emitting layer, electron transport layer, and electron injection layer which are stacked, and is formed in the pixel opening of the display region 100, to connect the organic light emitting layer 303 with the first electrode 301. The first electrode 301 is connected with the first drain electrode of the thin film transistor 210 to implement light emitting control over the organic light emitting layer 303. The second electrode 304 is partially formed on the organic light emitting layer 303.

In some exemplary implementation modes, the package layer 104 is formed on the underlay substrate 101 where the abovementioned patterns are formed. As shown in FIG. 4, the package layer 104 may adopt a stacked structure of an inorganic material/organic material/inorganic material. An organic material layer is arranged between two inorganic material layers.

In some exemplary implementation modes, the fifth insulating layer 15 and the pixel defining layer 302 may be made from an organic material such as polyimide, acrylic, or polyethylene terephthalate.

In the abovementioned preparation process, preparation processes of a scan driving circuit and a light emitting driving circuit are similar to the preparation process of the driving structure layer in the display region, and thus will not be elaborated herein.

The preparation process of the present exemplary embodiment may be implemented using an existing mature preparation device, and is compatible well with an existing preparation process, simple in process implementation, easy to implement, high in production efficiency and yield, and low in production cost.

The structure of the display substrate of the present exemplary embodiment and the preparation process thereof are described only as an example. In some exemplary implementation modes, changes in corresponding structures and addition or deletion of the patterning process may be made as practically required. For example, a first source and drain metal layer and a second source and drain metal layer may be arranged in the display region. The first source and drain metal layer may include the first source electrode and first drain electrode of the thin film transistor. The second source and drain metal layer may include a connecting electrode between the light emitting element and the first drain electrode. The first connection line may be in the same layer as the second source and drain metal layer. The first power line and the second connection line may be in the same layer as the first source and drain metal layer. However, no limits are made thereto in the present embodiment.

In the present exemplary implementation mode, the first connection line and the second connection line are arranged in the first edge region and third edge region on two opposite sides of the display region to connect the first initial signal line with the first power line. In the present embodiment, the uniformity of the display substrate under high and low gray scales may be improved greatly without enlarging the wiring space of the first border region and adding any pin to the bonding pin region, thereby improving the image quality.

The structure (or method) shown in the present implementation mode may be combined with structures (or methods) shown in other implementation modes as appropriate.

Figure 13:
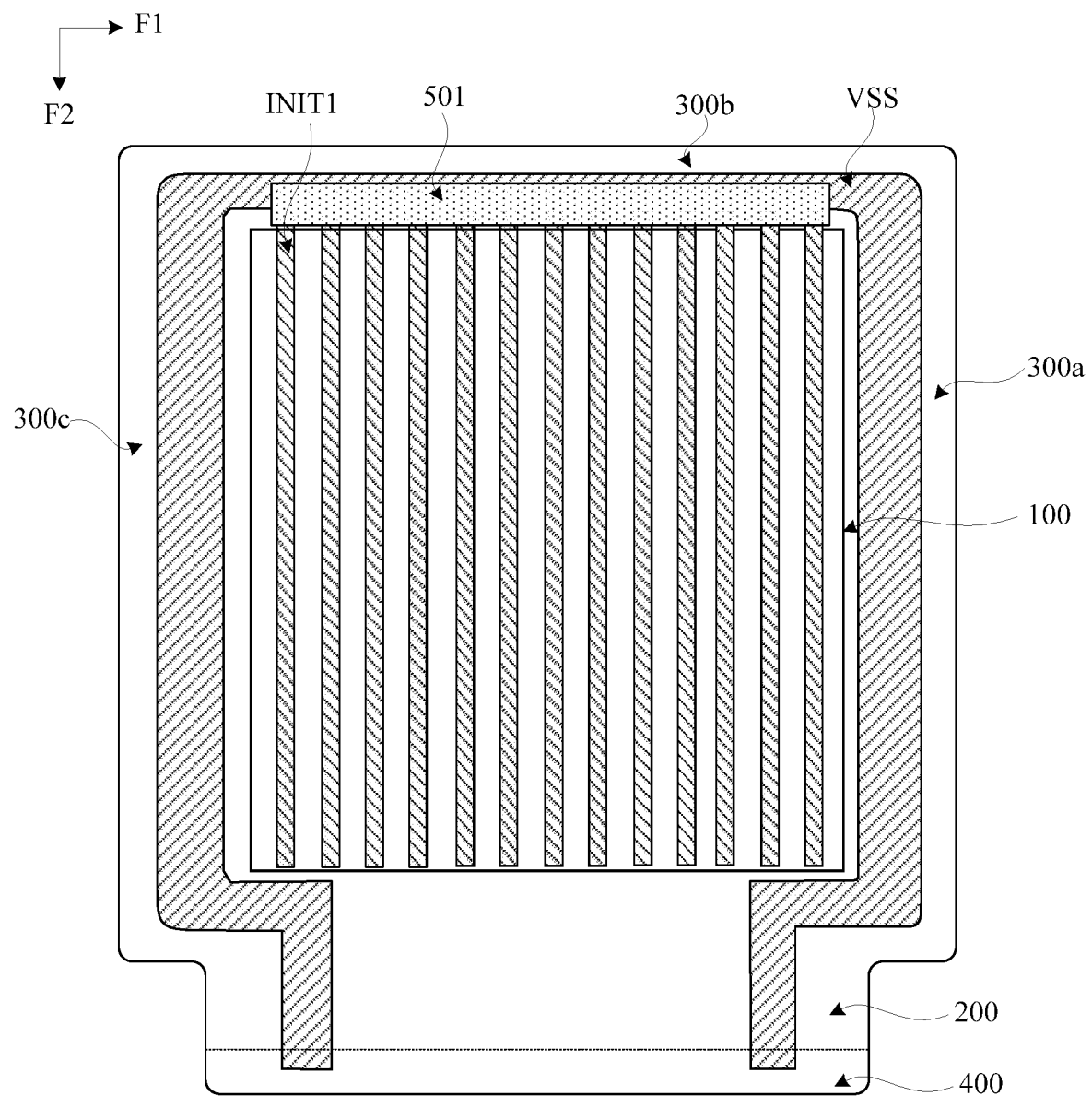
FIG. 13 is another schematic wiring diagram of a peripheral region of a display substrate according to at least one embodiment of the present disclosure.

FIG. 13 is another schematic wiring diagram of a peripheral region of a display substrate according to at least one embodiment of the present disclosure. As shown in FIG. 13, the first initial signal line INIT1 arranged in the display region 100 may extend in the second direction F2, and the multiple first initial signal line INIT1 may be arranged in the first direction F1. However, no limits are made thereto in the present embodiment. For example, the extending direction of the second initial signal line INIT2 arranged in the display region 100 may be the same as the extending direction of the first initial signal line INIT1, for example, extending in the second direction F2. Alternatively, the second initial signal line INIT2 may intersect with the extending direction of the first initial signal line INIT1. For example, the second initial signal line INIT2 extends in the first direction F1, and the first initial signal line INIT1 extends in the second direction F2.

In some exemplary implementation modes, as shown in FIG. 13, the first initial signal line INIT1 may extend from the display region 100 to the second edge region 300b of the second border region (for example, the upper border of the display substrate). For example, the first initial signal line INIT1 has a first extending terminal that extends to the second edge region 300b. The first power line VSS and the first connection line 501 are arranged in the second border region. Since the first power line VSS is arranged in all the first edge region 300a, the second edge region 300b, and the third edge region 300c, the multiple initial signal lines INIT1 may be connected with the first power line VSS through the first connection line 501 through the second edge region 300b. For example, the first extending terminal of the first initial signal line INIT1 is connected with the first terminal of the first connection line 501, and the second terminal of the first connection line 501 is connected with the first power line VSS. The first power line VSS is on the side of the first connection line 501 away from the display region 100. The first connection line 501 is on the side of the first initial signal line INIT1 away from the display region 100. The orthographic projection of the first connection line 501 on the underlay substrate overlaps the first power line VSS and the multiple first initial signal line INIT1. However, no limits are made thereto in the present embodiment. In some examples, the second connection line may also be arranged in the second edge region 300b. The extending direction of the second connection line is consistent with the extending direction of the first connection line. The second connection line is connected with the first power line through the first connection line and connected with the first initial signal line. Herein, the second connection line may be in the same layer as the first power line.

In some exemplary implementation modes, in the plane perpendicular to the display substrate, the driving structure layer in the display region 100 includes a semiconductor layer, first gate metal layer, second gate metal layer, first source and drain metal layer, and second source and drain metal layer which are sequentially arranged on the underlay substrate. The first source and drain metal layer may include the first source electrode and first drain electrode of the thin film transistor. The second source and drain metal layer may include a connecting electrode between the light emitting element and the first drain electrode. The first connection line 501 in the second edge region 300b may be in the same layer as the first electrode of the light emitting element. In some examples, the first initial signal line INIT1 may be in the same layer as the first source and drain metal layer, and the extending direction of the first initial signal line INIT1 may be parallel to the extending direction of the data signal line. Alternatively, in some examples, the first initial signal line INIT1 may be in the same layer as the second source and drain metal layer, or arranged in the same layer as the semiconductor layer. However, no limits are made thereto in the present embodiment. The first initial signal line is arranged in another conductive film layer that does not overlap the scanning signal line.

In the present exemplary implementation mode, the first initial signal line and the first power line may be connected in the second edge region (i.e., the upper border) of the display substrate, so that design of connecting structures in the first edge region and the second edge region (i.e., the left and right borders of the display region) may be avoided, to achieve a narrow border.

The other structures of the display substrate provided in the present embodiment may refer to the descriptions in the abovementioned embodiments, and thus will not be elaborated herein.

The structure (or method) shown in the present implementation mode may be combined with structures (or methods) shown in other implementation modes as appropriate.

Figure 14:
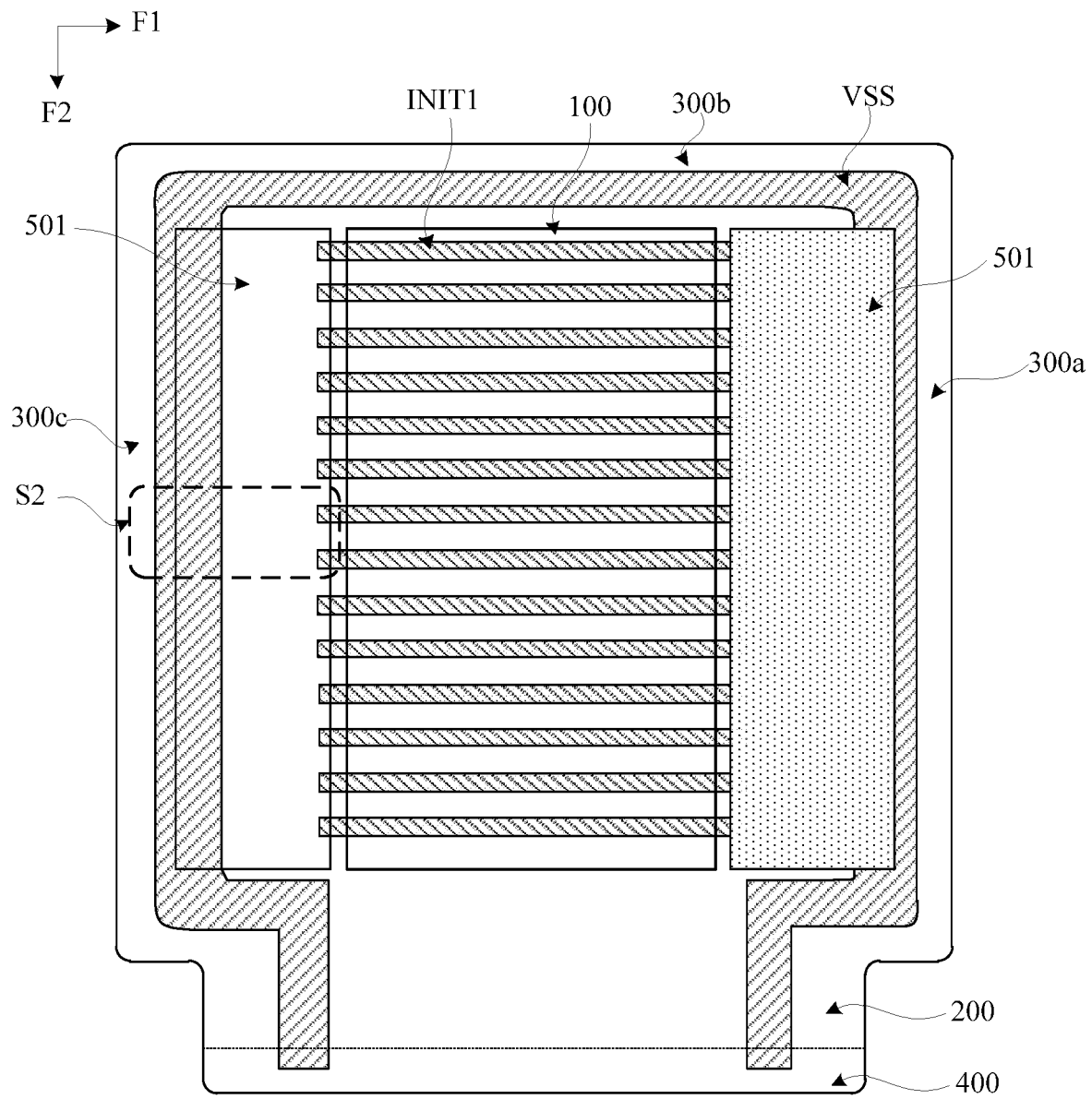
FIG. 14 is another schematic wiring diagram of a peripheral region of a display substrate according to at least one embodiment of the present disclosure.
Figure 15:
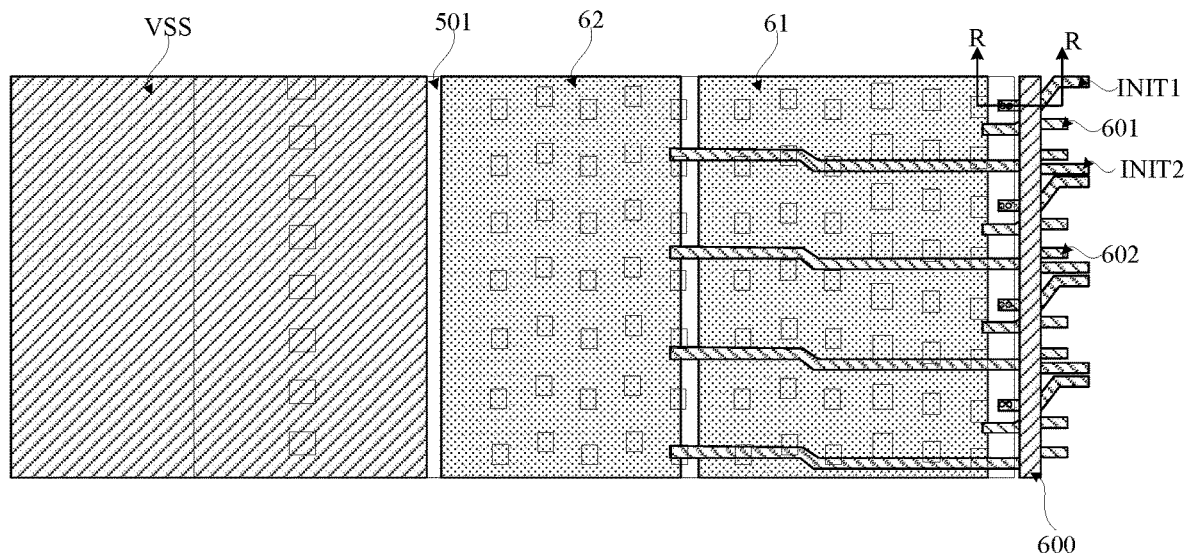
FIG. 15 and FIG. 16 are schematic partial enlarged views of region S2 in FIG. 14.
Figure 16:
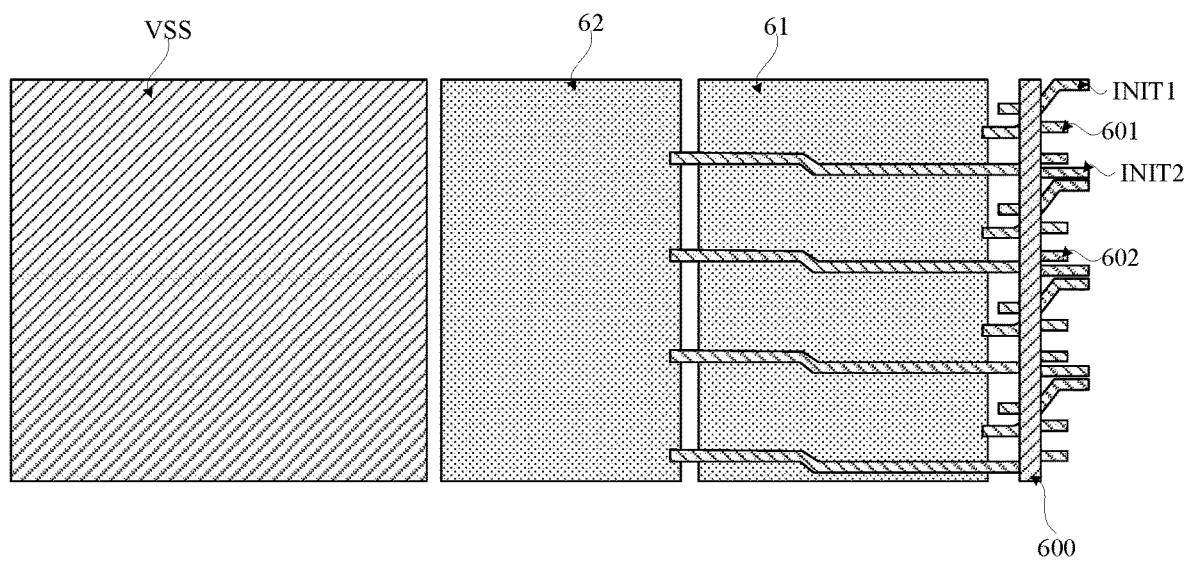
Figure 17:
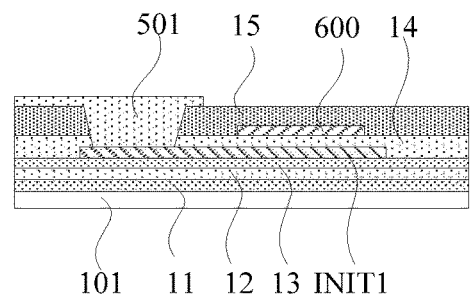
FIG. 17 is a schematic partial sectional view along R-R in FIG. 15.

FIG. 14 is another schematic wiring diagram of a peripheral region of a display substrate according to at least one embodiment of the present disclosure. FIG. 15 and FIG. 16 are schematic partial enlarged views of region S2 in FIG. 14. FIG. 17 is a schematic partial sectional view along R-R in FIG. 15. FIG. 15 is a partial schematic diagram of a third edge region after formation of a first connection line according to at least one embodiment of the present disclosure. FIG. 16 is a partial schematic diagram of a third edge region after formation of a first power line according to at least one embodiment of the present disclosure.

In some exemplary implementation modes, as shown in FIG. 14 to FIG. 16, the first connection line 501 is arranged in the second border region 300. In the first edge region 300a and the third edge region 300c, the first connection line 501 is connected with the first power line VSS and multiple first initial signal lines INIT1. The first connection line 501 may not be arranged in the second edge region 300b. In the present example, as shown in FIG. 15 and FIG. 17, the first connection line 501 is connected with the first power line VSS through the first groove formed in the fifth insulating layer 15, and is connected with the first initial signal line INIT1 through the second groove that penetrates through the fifth insulating layer 15 and the fourth insulating layer 14.

In the present exemplary implementation mode, the material of the first connection line 501 may be the same as the material of the anode of the organic light emitting layer, e.g., tin indium oxide (ITO) or a stacking of Ag/ITO/Ag.

In the present exemplary implementation mode, the first connection line 501 may be made in the same layer as the anode of the organic light emitting layer.

In the present exemplary implementation mode, the first connection line is arranged in the first edge region and third edge region on two opposite sides of the display region to connect the first initial signal line with the first power line. In the present embodiment, the uniformity of the display substrate under high and low gray scales may be improved greatly without enlarging the wiring space of the first border region and adding any pin to the bonding pin region, thereby improving the image quality.

The related structures of the display region and peripheral region of the present embodiment may refer to the descriptions in the abovementioned embodiments, and thus will not be elaborated herein.

The structure (or method) shown in the present implementation mode may be combined with structures (or methods) shown in other implementation modes as appropriate. For example, the first initial signal line INIT1 in the present exemplary implementation mode may extend in the second direction F2, and is connected with the first power line VSS in the second edge region 300b through the first connection line 501.

Figure 18:
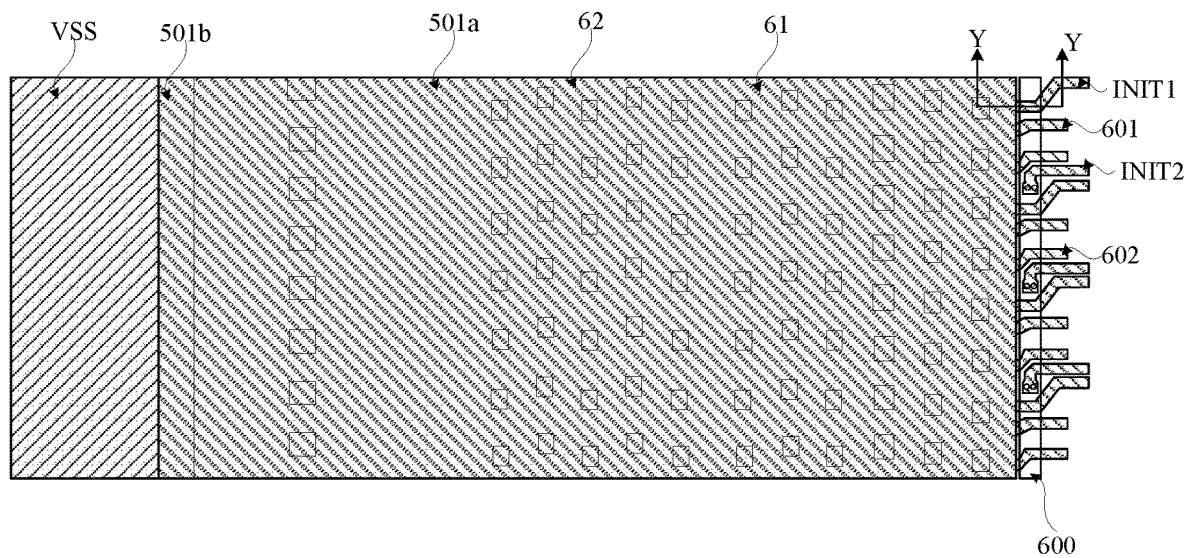
FIG. 18 and FIG. 19 are other schematic partial enlarged views of region S2 in FIG. 14.
Figure 19:
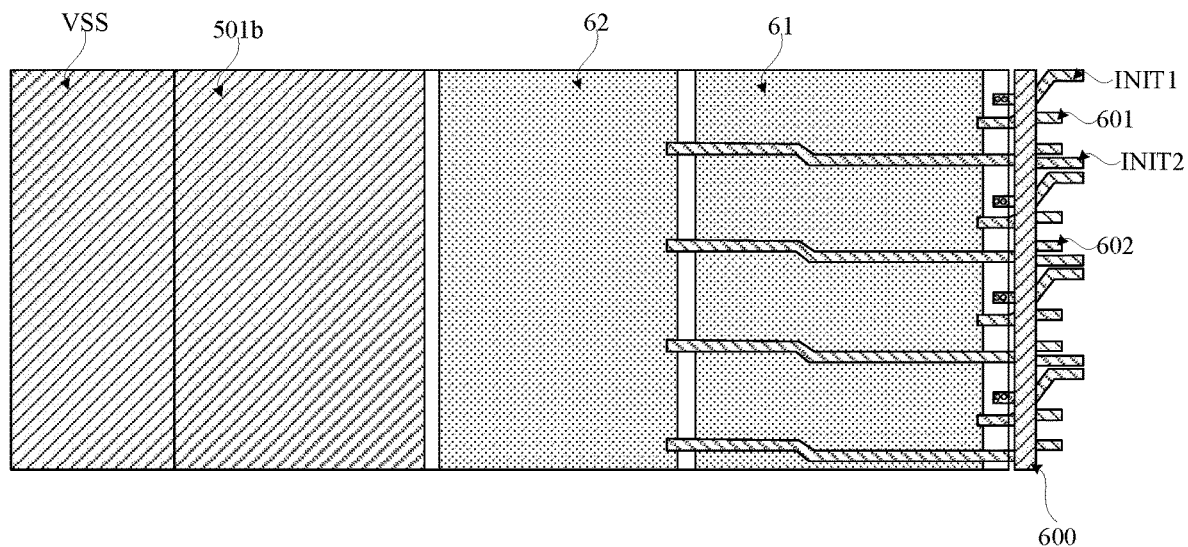
Figure 20:
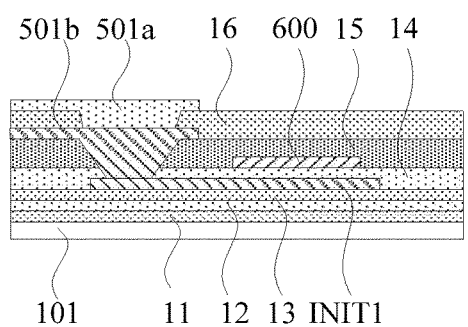
FIG. 20 is a schematic partial sectional view along Y-Y in FIG. 18.

FIG. 18 and FIG. 19 are other schematic partial enlarged views of region S2 in FIG. 14. FIG. 20 is a schematic partial sectional view along Y-Y in FIG. 18. FIG. 18 is a partial schematic diagram of a third edge region after formation of a first connection sub line according to at least one embodiment of the present disclosure. FIG. 19 is a partial schematic diagram of a third edge region after formation of a second connection sub line according to at least one embodiment of the present disclosure.

In some exemplary implementation modes, as shown in FIG. 14, FIG. 18, and FIG. 19, the first connection line is arranged in the second border region 300. In the present example, the first connection line is of a multilayer structure. For example, the first connection line includes a first connection sub line 501*a* and a second connection sub line 501*b*. The first connection line is arranged in the first edge region 300*a* and the third edge region 300*c*. The second connection sub line 501*b* is connected with the first power line VSS and the multiple first initial signal line INIT1. The first connection sub line 501*a* is connected with the second connection sub line 501*b*. In the present example, the driving structure layer in the display region 100 includes a semiconductor layer, first gate metal layer, second gate metal layer, first source and drain metal layer, and second source and drain metal layer which are sequentially arranged on the underlay substrate. The first connection sub line 501*a* is in the same layer as the first electrode of the light emitting element. The second connection sub line 501*b* is in the same layer as the second source and drain metal layer. The first power line VSS is in the same layer as the first source and drain metal layer. The first initial signal line INIT1 is in the same layer as the second gate metal layer. As shown in FIG. 18 and FIG. 20, the first connection sub line 501*a* is connected with the second connection sub line 501*b* through a groove in a sixth insulating layer 16. The second connection sub line 501*b* is connected with the first initial signal line INIT1 through the via that penetrates through the fifth insulating layer 15 and the fourth insulating layer 14. The fifth insulating layer 15 and the sixth insulating layer 16 may be flat layers prepared from an organic material.

In some exemplary implementation modes, the second connection sub line 501*b* may cover regions where the light emitting driving circuit 62 and the scan driving circuit 61 are located, and extend to a portion above the first initial signal line INIT1 to be connected with multiple first initial signal lines INIT1 through the via. The second connection sub line 501*b* also extends to a portion above the first power line VSS to be connected with the first power line VSS through the groove in the fifth insulating layer. In the present example, the second connection sub line 501*b* may be connected with the first power line VSS and the first initial signal line INIT1. However, no limits are made thereto in the present embodiment. For example, the second connection sub line may be connected with the first power line VSS only, and the first connection sub line is connected with the first initial signal line INIT1 and the second connection sub line, to electrically connect the first power line VSS with the first initial signal line INIT1. Alternatively, the second connection sub line may be connected with the first initial signal line INIT1 only, and the first connection sub line is connected with the second connection sub line and the first power line, to electrically connect the first power line VSS with the first initial signal line INIT1.

In the present exemplary implementation mode, the first connection line is arranged as a double-layer structure, the second connection sub line which is in the same layer as the second source and drain metal layer may be used to help the lap joint between different lines, and the lap joint of multiple layers may reduce the resistance and improve the signal transmission performance.

In the present exemplary implementation mode, the first connection sub line 501*a* may be made from the same material as the anode of the organic light emitting layer, e.g., ITO or a stacking of Ag/ITO/Ag. In the present exemplary implementation mode, the first connection sub line 501*a* may be made in the same layer as the anode of the organic light emitting layer.

In the present exemplary implementation mode, the material of the second connection sub line 501*b* may include a metal material, e.g., one or alloy of molybdenum, aluminum, copper, titanium, and niobium, or a molybdenum/titanium alloy or stacking, or a titanium/aluminum/titanium stacking.

In the present exemplary implementation mode, the material of the first power line VSS may include a metal material, e.g., one or alloy of molybdenum, aluminum, copper, titanium, and niobium, or a molybdenum/titanium alloy or stacking, or a titanium/aluminum/titanium stacking.

In the present exemplary implementation mode, the second connection sub line 501*b* may also be made from the same material or in the same layer as the other metal film layer in the pixel driving circuit. For example, it may be made in the same layer or from the same material as the gate metal layer. For example, for a Low Temperature Polycrystalline Oxide (LTPO) rear panel (an oxide and low-temperature polycrystalline composite rear panel), the second connection sub line 501*b* may be made from the same material and/or made in the same layer as a gate of an oxide transistor, e.g., one or alloy of molybdenum, aluminum, copper, titanium, and niobium, or a molybdenum/titanium alloy or stacking.

The other structures of the display substrate of the present embodiment may refer to the descriptions in the abovementioned embodiments, and thus will not be elaborated herein.

Figure 21:
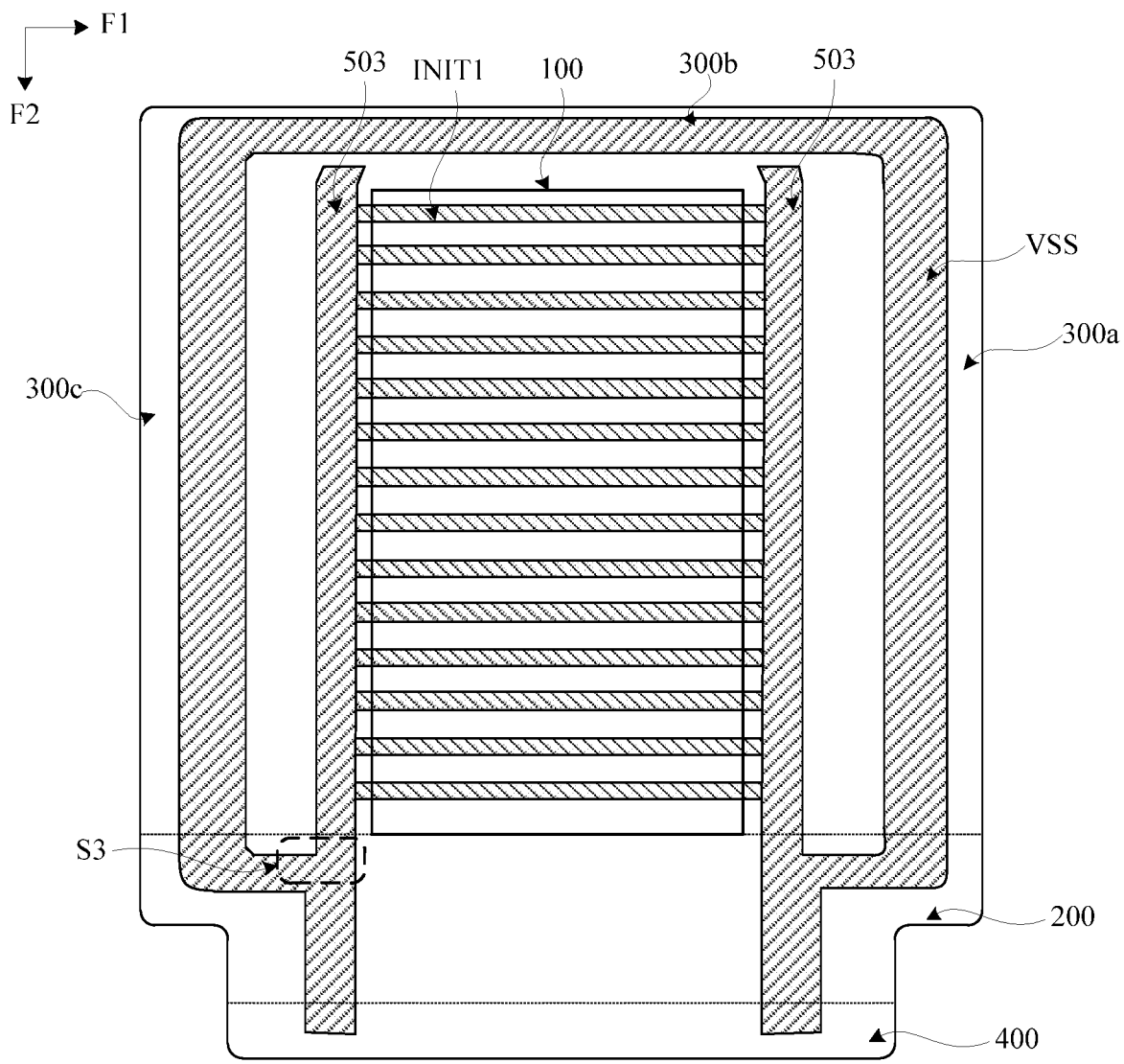
FIG. 21 is another schematic wiring diagram of a peripheral region of a display substrate according to at least one embodiment of the present disclosure.
Figure 22:
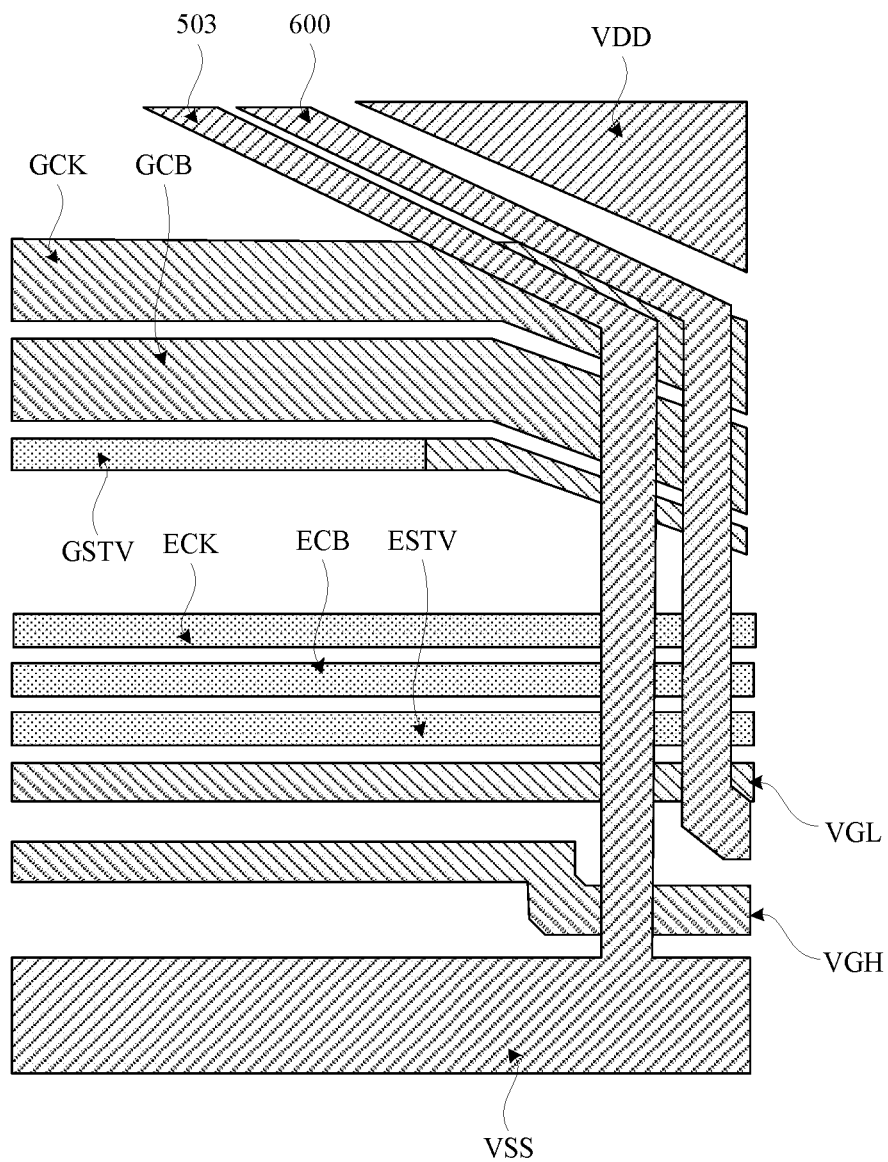
FIG. 22 is a schematic partial enlarged view of region S3 in FIG. 21.

The structure (or method) shown in the present implementation mode may be combined with structures (or methods) shown in other implementation modes as appropriate. For example, the first initial signal line INIT1 in the present exemplary implementation mode may extend in the second direction F2, and the first connection sub line and the second connection sub line may be arranged in the second edge region 300*b*, to electrically connect the first power line VSS with the first initial signal line INIT1. Alternatively, for example, based on the first connection line of the double-layer structure provided in the present exemplary implementation mode, the second connection line may also be arranged in the second border region. The second connection line may be in the same layer as the first source and drain metal layer, and is connected with the first initial signal line. The second connection line is connected with the second connection sub line. The second connection sub line is connected with the first connection sub line. The first connection sub line or the second connection sub line is connected with the first power line. As such, the first initial signal line is electrically connected with the first power line. FIG. 21 is another schematic wiring diagram of a peripheral region of a display substrate according to at least one embodiment of the present disclosure. FIG. 22 is a schematic partial enlarged view of region S3 in FIG. 21. In some exemplary implementation modes, as shown in FIG. 21, the first border region 200 is between the bonding pint region 400 and the display region 100. For example, in the direction away from the display region 100, the first border region 200 may include a first fanout region, a bending region, a second fanout region, an anti-static region, and a driving chip region. In the present example, a third connection line 503 is arranged in the first border region 200 and the second border region. The third connection line 503 is connected with the first initial signal line INIT1 in the first edge region 300*a* and third edge region 300*c* of the second border region and connected with the first power line VSS in the first border region 200. In the present example, the third connection line 503 and the first power line VSS are integrated, and a joint of the third connection line 503 and the first power line VSS may be in the first border region 200.

In some exemplary implementation modes, an extending direction of the third connection line 503 in the first edge region 300a and the third edge region 300c intersects with the extending direction of the first initial signal line INIT1 in the display region 100.

FIG. 22 is a schematic wiring diagram of the bottom-left corner position of the display substrate. In some exemplary implementation modes, as shown in FIG. 21 and FIG. 22, the third connection line 503 is on the side of the initial signal lead 600 away from the display region 100, and initial signal lead 600 is on the side of the second power line VDD away from the display region 100. The first power line VSS is divided into two paths when extending from the first border region 200 to the third edge region 300c. One path forms the third connection line 503 to be connected with the second extending terminal of the third edge region 300c in the third edge region 300c. The other path enters the third edge region 300c still as the first power line VSS.

In some exemplary implementation modes, as shown in FIG. 22, signal lines provided for the scan driving circuit and the light emitting driving circuit are arranged near the joint of the third connection line 503 and the first power line VSS. For example, a third power line VGH, a fourth power line VGL, a first signal line group provided for the light emitting GOA units, and a second signal line group provided for the scan GOA units are sequentially arranged on the side of the first power line VSS close to the display region 100. The first signal line group may include a first starting signal line ESTV and clock signal lines ECB and ECK. The second signal line group includes a second starting signal line GSTV and clock signal lines GCB and GCK. In some examples, the third power line VGH, the fourth power line VGL, and the clock signal lines GCB and GCK may be in the same layer as the second gate metal layer in the display region. The first starting signal line ESTV and the clock signal lines ECB and ECK may be in the same layer as the first gate metal layer in the display region. The starting signal line GSTV may be in the same layer as the first gate metal layer, and is connected with a line in the same layer as the second gate metal layer to receive a scan starting signal.

In the present exemplary implementation mode, the third connection line and the first power line are integrally connected in the first border region to electrically connect the first power line with the first initial signal line, so that the uniformity of the display substrate under high and low gray scales may be improved greatly without enlarging the wiring space of the first border region and adding any pin to the bonding pin region, to improve the image quality.

The related structures of the display region and peripheral region of the present embodiment may refer to the descriptions in the abovementioned embodiments, and thus will not be elaborated herein.

The structure (or method) shown in the present implementation mode may be combined with structures (or methods) shown in other implementation modes as appropriate. For example, the first initial signal line in the present exemplary implementation mode may extend in the second direction. The third connection line may be arranged in the first edge region, the second edge region, and the third region. The first initial signal line may be connected with the third connection line in the second edge region. Alternatively, the first initial signal line may be connected with the first power line in the second edge region.

Figure 23:
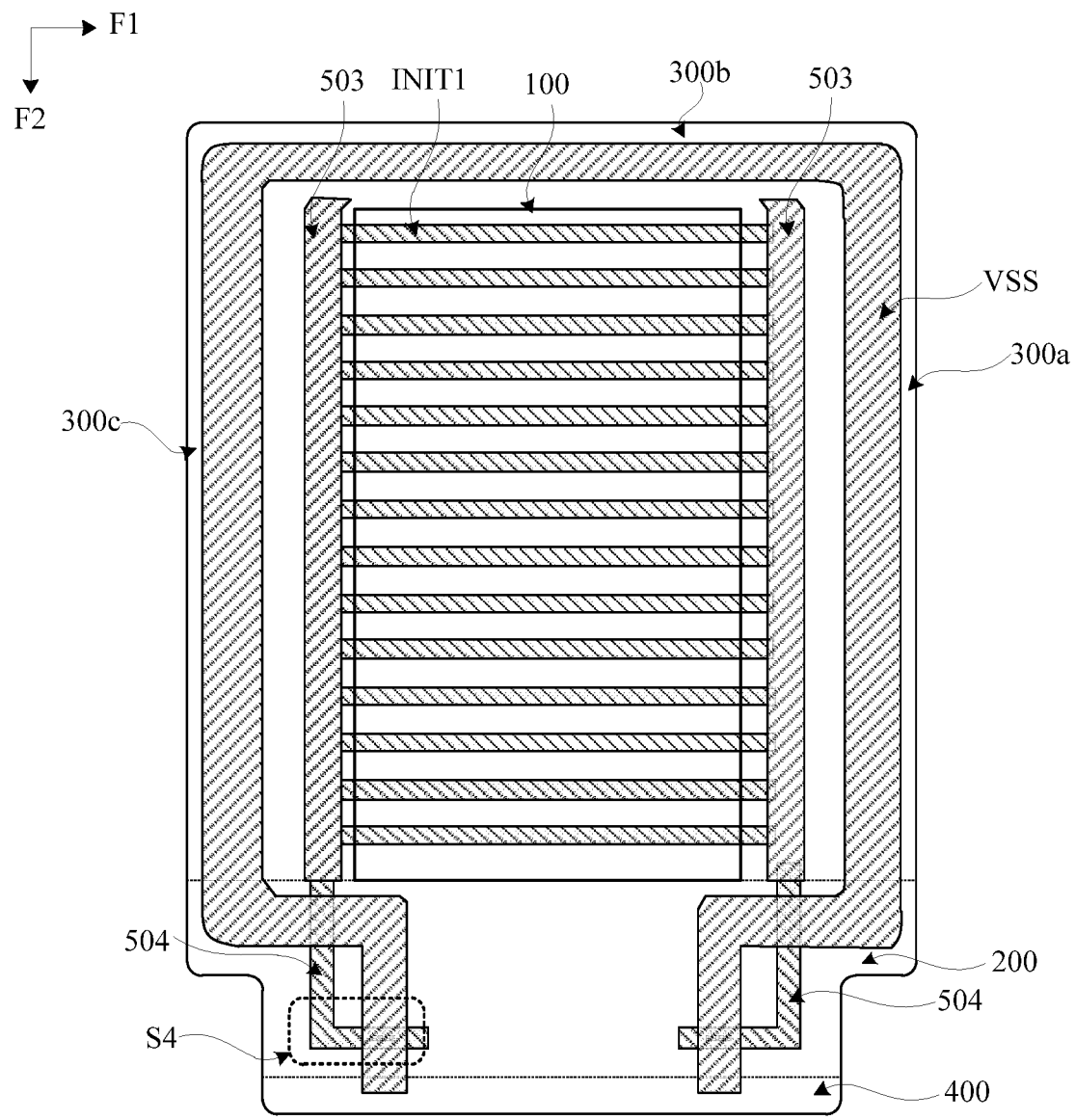
FIG. 23 is another schematic diagram of a peripheral region of a display substrate according to at least one embodiment of the present disclosure.
Figure 24:
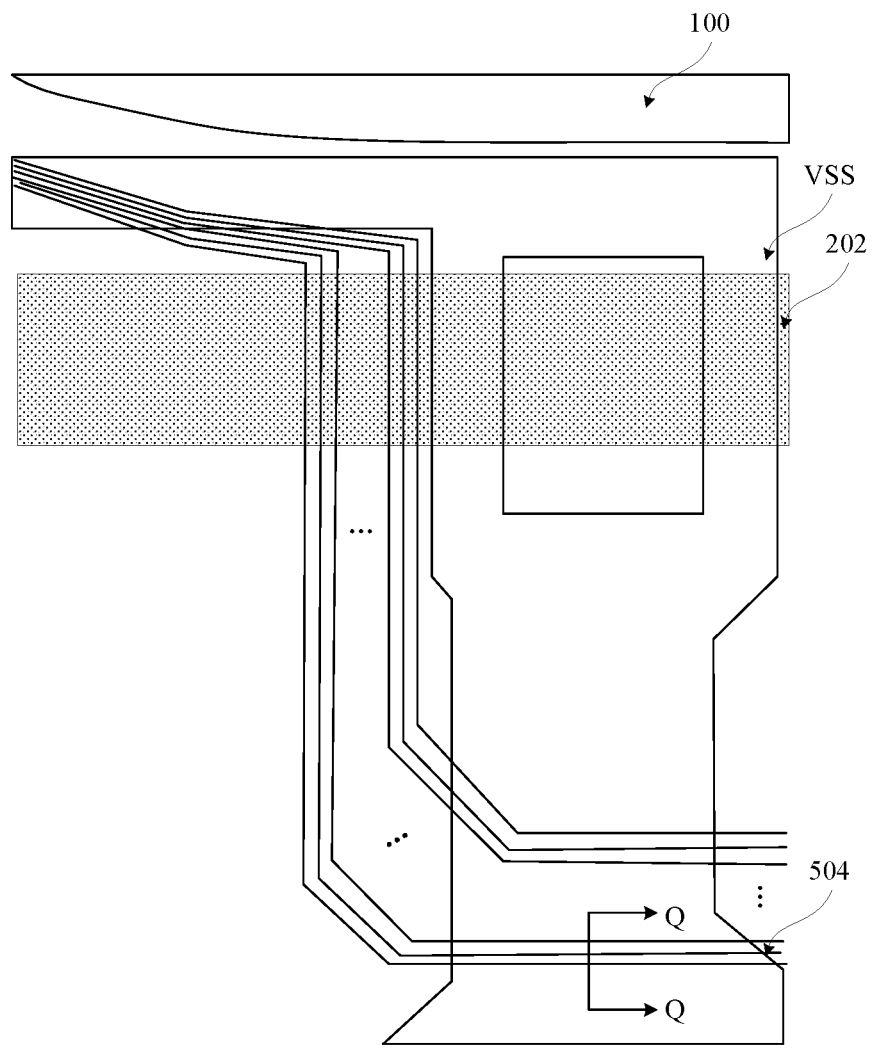
FIG. 24 is a schematic partial enlarged view of region S4 in FIG. 23.
Figure 25:
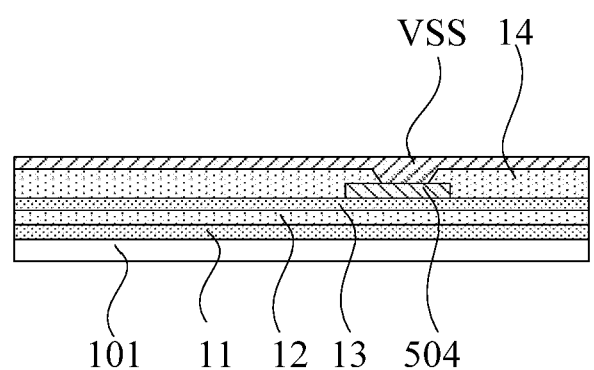
FIG. 25 is a schematic partial sectional view along Q-Q in FIG. 24.

FIG. 23 is another schematic wiring diagram of a peripheral region of a display substrate according to at least one embodiment of the present disclosure. FIG. 24 is a schematic partial enlarged view of region S4 in FIG. 23. FIG. 25 is a schematic sectional view along Q-Q in FIG. 24. In some exemplary implementation modes, as shown in FIG. 23, the third connection line 503 is connected with the first initial signal line INIT1 in the first edge region 300a and third edge region 300c of the second border region 300, and is connected with one terminal of the fourth connection line 504 in the first border region 200, the junction of the first border region 200 and the third edge region 300c, or the third edge region 300c. The other terminal of the fourth connection line 504 is connected with the first power line VSS in the first border region 200.

In some exemplary implementation modes, as shown in FIG. 24, a joint of the fourth connection line 504 and the first power line VSS may be on a side of the bending region 202 away from the display region 100. An extending direction of the fourth connection line 504 in the first border region 200 may be the same as extending directions of the clock signal lines and starting signal lines provided for the scan driving circuit and the light emitting driving circuit.

In some exemplary implementation modes, as shown in FIG. 25, the fourth connection line 504 may be in the same layer as the second gate metal layer in the display region 100, and the first power line VSS may be in the same layer as the source and drain metal layer in the display region 100. The first power line VSS may be connected with the fourth connection line 504 through the via formed in the fourth insulating layer 14. When the third connection line 503 is in the same layer as the first power line VSS, the fourth connection line 504 may be connected with the third connection line 503 through the via formed in the fourth insulating layer. However, no limits are made thereto in the present embodiment. FIG. 25 omits the other lines in the same layer as the fourth connection line 504.

In the present exemplary implementation mode, the fourth connection line and the first power line are electrically connected in the first border region to electrically connect the first power line with the first initial signal line through the third connection line and the fourth connection line, so that the uniformity of the display substrate under high and low gray scales may be improved greatly without enlarging the wiring space of the first border region and adding any pin to the bonding pin region, to improve the image quality.

The related structures of the display region and peripheral region of the present embodiment may refer to the descriptions in the abovementioned embodiments, and thus will not be elaborated herein.

The structure (or method) shown in the present implementation mode may be combined with structures (or methods) shown in other implementation modes as appropriate. For example, the first initial signal line in the present exemplary implementation mode may extend in the second direction. The third connection line may be arranged in the first edge region, the second edge region, and the third region. The first initial signal line may be connected with the third connection line in the second edge region.

At least one embodiment of the present disclosure also provides a preparation method of a display substrate, which is used for preparing the display substrate as described in the above embodiments. The preparation method of the display substrate in the present embodiment includes: forming multiple sub-pixels in a display region, and forming a first power line and a signal connection line in a peripheral region on a periphery of the display region. Herein, at least one sub-pixel includes a pixel driving circuit arranged on an underlay substrate and a light emitting element connected with the pixel driving circuit. The pixel driving circuit is connected with a first initial signal line. The first initial signal line is arranged to provide a first initial voltage to the light emitting element under the control of the pixel driving circuit. The first initial signal line is connected with the first power line through the signal connection line in the peripheral region.

The preparation method of the display substrate in the present embodiment may refer to the descriptions in the abovementioned embodiments, and thus will not be elaborated herein.

Figure 26:
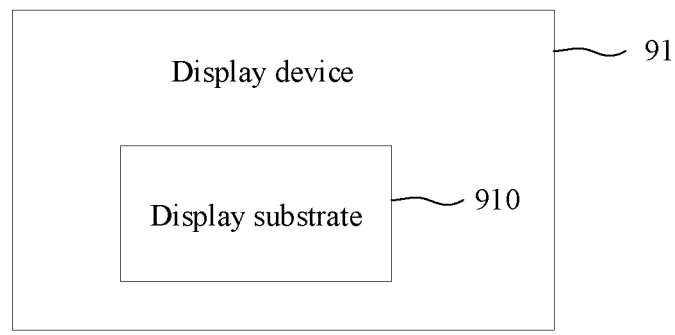
FIG. 26 is a schematic diagram of a display device according to at least one embodiment of the present disclosure.

FIG. 26 is a schematic diagram of a display device according to at least one embodiment of the present disclosure. As shown in FIG. 26, the present embodiment provides a display device 91, which includes a display substrate 910. The display substrate 910 is the display substrate provided in the abovementioned embodiments. Herein, the display substrate 910 may be an OLED display substrate. The display device 91 may be any product or component with a display function, such as an OLED display device, a mobile phone, a tablet computer, a television, a display, a notebook computer, a digital photo frame, and a navigator. However, no limits are made thereto in the present embodiment.

The drawings of the present disclosure only involve the structures involved in the present disclosure, and the other structures may refer to conventional designs. The embodiments in the present disclosure, i.e., the features in the embodiments, can be combined without conflicts to obtain new embodiments.

Those of ordinary skill in the art should know that modifications or equivalent replacements may be made to the technical solutions of the present disclosure without departing from the spirit and scope of the technical solutions of the present disclosure, and shall all fall within the scope of the claims of the present disclosure.

What is claimed is:

1. A display substrate, comprising:
a display region and a peripheral region on a periphery of the display region, wherein
at least multiple sub-pixels are arranged in the display region, and at least one of the at least multiple sub-pixels comprises a pixel driving circuit arranged on an underlay substrate and a light emitting element connected with the pixel driving circuit; the pixel driving circuit is connected with a first initial signal line, and the first initial signal line is arranged to provide a first initial voltage to the light emitting element under control of the pixel driving circuit; and
a first power line and a signal connection line are arranged in the peripheral region, and the first initial signal line is connected with the first power line through the signal connection line in the peripheral region;
wherein the peripheral region comprises a first border region, a second border region, and a bonding pin region, the bonding pin region is on one side of the display region, the first border region is between the bonding pin region and the display region, and the second border region is connected with the first border region to surround the display region;
the signal connection line comprises a first connection line; the first connection line is connected with the first initial signal line and the first power line in the second border region; and
the first connection line is on a side of the first power line close to the display region.

2. The display substrate according to claim 1, wherein the first connection line is on a side of the first power line away from the underlay substrate.

3. The display substrate according to claim 1, wherein the signal connection line further comprises a second connection line, and the second connection line is connected with the first initial signal line and connected with the first power line through the first connection line; and
the second connection line is on a side of the first connection line close to the display region.

4. The display substrate according to claim 3, wherein the second connection line is on a side of the first connection line close to the underlay substrate and is on a side of the first initial signal line away from the underlay substrate.

5. The display substrate according to claim 3, wherein the second connection line is in the same layer as the first power line.

6. The display substrate according to claim 1, wherein an extending direction of the first connection line in the peripheral region intersects with an extending direction of the first initial signal line in the display region.

7. The display substrate according to claim 1, wherein the display region comprises a driving structure layer arranged on the underlay substrate and the light emitting element, and the light emitting element comprises a first electrode, a second electrode, and an organic light emitting layer arranged between the first electrode and the second electrode; the first electrode is on a side of the second electrode close to the underlay substrate; and
the first connection line is in the same layer as the first electrode of the light emitting element.

8. The display substrate according to claim 7, wherein the driving structure layer comprises a semiconductor layer, a first gate metal layer, a second gate metal layer, and a source and drain metal layer which are arranged on the underlay substrate; and
the first initial signal line is in the same layer as the second gate metal layer, and the first power line is in the same layer as the source and drain metal layer.

9. The display substrate according to claim 1, wherein the pixel driving circuit comprises a first transistor to a seventh transistor;
a control electrode of the first transistor is connected with a second scanning signal line, a first electrode of the first transistor is connected with a second initial signal line, and a second electrode of the first transistor is connected with a first node;
a control electrode of the second transistor is connected with a first scanning signal line, a first electrode of the second transistor is connected with the first node, and a second electrode of the second transistor is connected with a third node;
a control electrode of the third transistor is connected with the first node, a first electrode of the third transistor is connected with a second node, and a second electrode of the third transistor is connected with the third node;
a control electrode of the fourth transistor is connected with flail the first scanning signal line, a first electrode of the fourth transistor is connected with a data signal line, and a second electrode of the fourth transistor is connected with the second node;
a control electrode of the fifth transistor is connected with a light emitting signal line, a first electrode of the fifth transistor is connected with a second power line, and a second electrode of the fifth transistor is connected with the second node;
a control electrode of the sixth transistor is connected with the light emitting signal line, a first electrode of the sixth transistor is connected with the third node, and a second electrode of the sixth transistor is connected with a fourth node;
a control electrode of the seventh transistor is connected with the first scanning signal line, a first electrode of the seventh transistor is connected with the first initial signal line, and a second electrode of the seventh transistor is connected with the fourth node; and a first electrode of the light emitting element is connected with the fourth node, and a second electrode of the light emitting element is connected with the first power line.

10. A display device, comprising the display substrate according to claim 1.

11. A preparation method of a display substrate, for preparing the display substrate according to claim 1, the preparation method comprising:

forming multiple sub-pixels in a display region, and forming a first power line and a signal connection line in a peripheral region on a periphery of the display region, wherein at least one sub-pixel comprises a pixel driving circuit arranged on an underlay substrate and a light emitting element connected with the pixel driving circuit; the pixel driving circuit is connected with a first initial signal line, and the first initial signal line is arranged to provide a first initial voltage to the light emitting element under control of the pixel driving circuit and the first initial signal line is connected with the first power line through the signal connection line in the peripheral region.

12. The display substrate according to claim 2, wherein the signal connection line further comprises a second connection line, and the second connection line is connected with the first initial signal line and connected with the first power line through the first connection line; and the second connection line is on a side of the first connection line close to the display region.

13. The display substrate according to claim 12, wherein the second connection line is on a side of the first connection line close to the underlay substrate and is on a side of the first initial signal line away from the underlay substrate.

14. The display substrate according to claim 3, wherein an extending direction of the first connection line in the peripheral region intersects with an extending direction of the first initial signal line in the display region.

15. The display substrate according to claim 3, wherein the display region comprises a driving structure layer arranged on the underlay substrate and the light emitting element, and the light emitting element comprises a first electrode, a second electrode, and an organic light emitting layer arranged between the first electrode and the second electrode; the first electrode is on a side of the second electrode close to the underlay substrate; and the first connection line is in the same layer as the first electrode of the light emitting element.

16. A display substrate, comprising:

a display region and a peripheral region on a periphery of the display region, wherein at least multiple sub-pixels are arranged in the display region, and at least one of the at least multiple sub-pixels comprises a pixel driving circuit arranged on an underlay substrate and a light emitting element connected with the pixel driving circuit; the pixel driving circuit is connected with a first initial signal line, and the first initial signal line is arranged to provide a first initial voltage to the light emitting element under control of the pixel driving circuit; and a first power line and a signal connection line are arranged in the peripheral region, and the first initial signal line is connected with the first power line through the signal connection line in the peripheral region;

wherein the peripheral region comprises a first border region, a second border region, and a bonding pin region, the bonding pin region is on one side of the display region, the first border region is between the bonding pin region and the display region, and the second border region is connected with the first border region to surround the display region;

the signal connection line comprises a third connection line, and the third connection line is connected with the first initial signal line in the second border region and connected with the first power line in the first border region.

17. The display substrate according to claim 16, wherein the third connection line and the first power line are integrated.

18. The display substrate according to claim 16, wherein the signal connection line further comprises a fourth connection line; the third connection line is connected with the fourth connection line, and the fourth connection line is connected with the first power line in the first border region; and the fourth connection line is on a side of the first power line close to the underlay substrate.

19. A display device, comprising the display substrate according to claim 16.

20. A preparation method of a display substrate, for preparing the display substrate according to claim 16, the preparation method comprising:

forming multiple sub-pixels in a display region, and forming a first power line and a signal connection line in a peripheral region on a periphery of the display region, wherein at least one sub-pixel comprises a pixel driving circuit arranged on an underlay substrate and a light emitting element connected with the pixel driving circuit; the pixel driving circuit is connected with a first initial signal line, and the first initial signal line is arranged to provide a first initial voltage to the light emitting element under control of the pixel driving circuit and the first initial signal line is connected with the first power line through the signal connection line in the peripheral region.

* * * * *